United States Patent
Megyese et al.

(10) Patent No.: US 11,954,315 B1
(45) Date of Patent: Apr. 9, 2024

(54) SYSTEMS AND METHODS FOR DYNAMICALLY CREATING AND ADJUSTING SCENE MODELS

(71) Applicant: State Farm Mutual Automobile Insurance Company, Bloomington, IL (US)

(72) Inventors: Matthew Megyese, Phoenix, AZ (US); Anna Zarkoob, Phoenix, AZ (US); Alexander Cardona, Gilbert, AZ (US)

(73) Assignee: State Farm Mutual Automobile Insurance Company, Bloomington, IL (US)

( * ) Notice: Subject to any disclaimer, the term of this patent is extended or adjusted under 35 U.S.C. 154(b) by 0 days.

(21) Appl. No.: 17/183,147

(22) Filed: Feb. 23, 2021

Related U.S. Application Data

(60) Provisional application No. 63/115,971, filed on Nov. 19, 2020.

(51) Int. Cl.
*G06F 3/04845* (2022.01)
*G06F 16/29* (2019.01)
*G06F 30/20* (2020.01)
*G07C 5/00* (2006.01)

(52) U.S. Cl.
CPC .......... *G06F 3/04845* (2013.01); *G06F 16/29* (2019.01); *G06F 30/20* (2020.01); *G07C 5/008* (2013.01)

(58) Field of Classification Search
None
See application file for complete search history.

(56) References Cited

U.S. PATENT DOCUMENTS

| | | | |
|---|---|---|---|
| 8,612,090 B2 | 12/2013 | Nielsen et al. | |
| 8,620,518 B2 | 12/2013 | Bradley et al. | |
| 9,311,271 B2 | 4/2016 | Wright | |
| 9,604,563 B1* | 3/2017 | Wilson, II | G06Q 40/08 |
| 9,633,487 B2 | 4/2017 | Wright | |
| 9,691,189 B1 | 6/2017 | Creath | |
| 9,886,841 B1* | 2/2018 | Nave | G06V 20/56 |
| 9,910,443 B1* | 3/2018 | Lee | G08G 1/166 |
| 10,121,291 B2 | 11/2018 | Cuddihy et al. | |

(Continued)

FOREIGN PATENT DOCUMENTS

| | | |
|---|---|---|
| CA | 2842332 C | 11/2017 |
| CN | 106790367 A | 5/2017 |

(Continued)

*Primary Examiner* — Haimei Jiang
(74) *Attorney, Agent, or Firm* — Armstrong Teasdale LLP

(57) ABSTRACT

In one aspect, a graphical user interface (GUI) for a dynamic model creation (DMC) system may be provided. The GUI may include: (i) a first display area programmed to display the at least one model including a visual representation of a determined location where a collision occurred, and/or (ii) a second display area programmed to display at least one data table corresponding to the at least one model, wherein movement of a visual representation of a vehicle on the GUI during a simulation of the at least one model is controlled at least by telematics data, and wherein the GUI is configured to receive user inputs such that the visual representations in the first display area and the at least one data table in the second display area are dynamically modifiable by a user.

20 Claims, 9 Drawing Sheets

(56) References Cited

U.S. PATENT DOCUMENTS

| | | | | |
|---|---|---|---|---|
| 10,145,684 | B1* | 12/2018 | Tofte et al. | G06T 7/246 |
| 10,192,369 | B2 | 1/2019 | Wright | |
| 10,198,879 | B2 | 2/2019 | Wright | |
| 10,365,959 | B2 | 7/2019 | Gadi et al. | |
| 10,373,387 | B1* | 8/2019 | Fields | G06T 11/00 |
| 10,387,962 | B1 | 8/2019 | Potter et al. | |
| 10,419,878 | B1* | 9/2019 | Sanchez | H04W 4/025 |
| 10,713,717 | B1* | 7/2020 | Hanson | G06Q 40/04 |
| 10,719,966 | B1* | 7/2020 | Davis | G06F 16/29 |
| 10,761,542 | B1* | 9/2020 | Fairfield | B60W 30/182 |
| 10,994,727 | B1* | 5/2021 | Kumar | G06Q 30/0213 |
| 11,087,292 | B2* | 8/2021 | Utke | G06V 10/764 |
| 2010/0256863 | A1* | 10/2010 | Nielsen | G06T 11/60 |
| | | | | 701/31.4 |
| 2015/0127570 | A1* | 5/2015 | Doughty | G06Q 50/265 |
| | | | | 705/325 |
| 2015/0149218 | A1* | 5/2015 | Bayley | B60R 21/0136 |
| | | | | 705/4 |
| 2017/0228410 | A1* | 8/2017 | Slusar | G06F 21/6245 |
| 2017/0267238 | A1* | 9/2017 | Mimura | B60W 30/182 |
| 2019/0043273 | A1* | 2/2019 | Cordova | G07C 5/0841 |
| 2019/0073641 | A1* | 3/2019 | Utke | G06T 7/0004 |
| 2019/0179320 | A1* | 6/2019 | Pacala et al. | G01S 17/87 |
| 2020/0334928 | A1* | 10/2020 | Bourke | G06Q 30/0283 |
| 2022/0005291 | A1* | 1/2022 | Konrardy | B60W 60/0015 |

FOREIGN PATENT DOCUMENTS

| | | |
|---|---|---|
| CN | 108629274 A | 10/2018 |
| WO | 2020141485 A1 | 7/2020 |

\* cited by examiner

SYSTEMS AND METHODS FOR DYNAMICALLY CREATING AND ADJUSTING SCENE MODELS

CROSS-REFERENCE TO RELATED APPLICATIONS

This application claims priority to U.S. Provisional Patent Application No. 63/115,971, filed Nov. 19, 2020, entitled "SYSTEMS AND METHODS FOR DYNAMICALLY CREATING AND ADJUSTING SCENE MODELS," all of which is hereby incorporated by reference in its entirety.

FIELD OF THE DISCLOSURE

The present disclosure relates to systems and methods for analyzing collected data, and more particularly, to systems and methods for analyzing collected telematics data and/or data collected from a user to dynamically create and adjust scene models.

BACKGROUND

Auto insurance provides financial protection against physical damage and/or bodily injury caused by a vehicular accident. Auto insurance policies may typically provide coverage for loss or damage to personal possessions of a policyholder during a policy claim (e.g., a formal request by the policyholder to an insurance provider for reimbursement for one or more personal possessions covered under an insurance policy). Loss events may include vehicle damage and/or other events that cause partial or complete loss of the personal possessions of the policyholder.

The policy claim process mentioned above may be currently highly manual and costly to all parties involved. In order to analyze a policy claim regarding a vehicular accident, an insurance representative (e.g., an employee of an insurance company) gathers information from drivers involved in the accident. In order to visually re-create the scene of the accident, the insurance representative may use objects such as toy cars placed on a hand-drawn map (e.g., hand-drawn by the claims associated and based off of a map found on the Internet). Further, scene models acquired from a third party (e.g., a police department) may often be sketched based off of driver accounts, and may be costly and untimely to acquire.

Thus, the majority of the current policy claim process may be open to human error by insurance representatives, parties involved in the accident, and/or third party accounts of the accident. Current solutions may also be inefficient, cumbersome, untimely, burdensome, and/or have other drawbacks.

BRIEF SUMMARY

In general, the present embodiments may relate to, inter alia, a solution that may take into consideration both (i) data collected from other reliable sources (e.g., vehicular, smart vehicle, autonomous vehicle, aerial vehicle (e.g., drone), smart infrastructure, mobile devices, smart home, and/or geolocation data (including sensor, audio, and camera/video data) along with scene photos and vehicle damage photos), and (ii) driver accounts (e.g., acquired when an insurance representative interviews a driver—such as acquired after (or alternatively, before) the data collected from the other reliable sources is analyzed and synthesized). More specifically, the present embodiments may relate to systems and methods for analyzing collected data to dynamically create and adjust scene models.

The models may be built using driver accounts (e.g., data obtained from drivers involved in an accident) along with other collected data including telematics, positioning, smart vehicle, smart infrastructure, smart home, mobile device, drone, aerial, and/or environmental data, including sensor, audio, and camera/video data. In some embodiments, the system may analyze historical data when generating a model (e.g., data collected regarding previous accidents at a particular intersection). Accordingly, the collected data may be input into and/or generated by the system to generate a scene model of a particular accident.

In other embodiments, the system may generate more than one model for a particular accident. For example, the system may generate a first model based upon data collected from non-human sources (e.g., telematics, positioning, smart vehicle, autonomous vehicle, smart infrastructure, smart home, drone, mobile device, aerial, and/or environmental data, including sensor, audio, and camera/video data), a second model based upon a first driver account, a third model based upon a second driver account, and a fourth model based upon analysis of each of the first three models (e.g., analyzing all collected data to generate a fourth model depicting a most-likely accident scene). Accordingly, the modeling system generates models to assist not only a claims associate, but also other parties (e.g., police departments, attorneys, insured parties, drivers, passengers, etc.) in potential subrogation after a claim is filed. In some embodiments, the claims associate may have access to the virtual collision reconstruction during the initial conversation with a driver or passenger of a vehicle involved with the collision, such as to facilitate the conversion with the driver or passenger, and to verify the accuracy of the virtual collision reconstruction created from other data sources, and/or to facilitate adjusting the virtual collision reconstruction created from other data sources with driver or passenger statements or other input.

In one aspect, a graphical user interface (GUI) for a dynamic model creation (DMC) system may be provided. The DMC system may include a DMC computing device in communication with a database, the database storing at least one model generated by the DMC computing device for representing a vehicle involved in a collision based upon collected data. The GUI may include: (i) a first display area programmed to display the at least one model including a visual representation of a determined location where the collision occurred, the visual representation of the determined location based in part on map data retrieved from the database and a visual representation of the vehicle involved in the collision; and/or (ii) a second display area programmed to display at least one data table corresponding to the at least one model, the at least one data table including telematics data regarding the vehicle involved in the collision, wherein movement of the visual representation of the vehicle on the GUI during a simulation of the at least one model is controlled at least by the telematics data, and wherein the GUI is configured to receive user inputs such that the visual representations in the first display area and the at least one data table in the second display area are dynamically modifiable by a user. The GUI may include additional, less, or alternate actions, including those discussed elsewhere herein.

In another aspect, a computer-implemented method for controlling a graphical user interface (GUI) for a dynamic model creation (DMC) system may be provided. The DMC system may include a DMC computing device in communication with a database, the database storing at least one model generated by the DMC computing device for representing a vehicle involved in a collision based upon collected data. The computer-implemented method may include, via the DMC system and/or DMC computing device, and/or via one or more local or remote processors, memory units, sensors, servers, and/or transceivers: (i) displaying a first display area wherein the first display area is programmed to display the at least one model including a visual representation of a determined location where the collision occurred, the visual representation of the determined location based in part on map data retrieved from the database and a visual representation of the vehicle involved in the collision; and/or (ii) displaying a second display area wherein the second display area is programmed to display at least one data table corresponding to the at least one model, the at least one data table including telematics data regarding the vehicle involved in the collision, wherein movement of the visual representation of the vehicle on the GUI during a simulation of the at least one model is controlled at least by the telematics data and wherein the GUI is configured to receive user inputs such that the visual representations in the first display area and the at least one data table in the second display area are dynamically modifiable by a user. The computer-implemented method may include additional, less, or alternate actions, including those discussed elsewhere herein.

In yet another aspect a non-transitory computer-readable media having computer-executable instructions embodied thereon may be provided. When executed by a dynamic model creation (DMC) system including a DMC computing device including a processor in communication with a memory device, the memory device storing at least one model generated by the DMC computing device for representing a vehicle involved in a collision based upon collected data, the computer-executable instructions may cause the processor to control a graphical user interface (GUI) included in the DMC system to: (i) display a first display area wherein the first display area is programmed to display the at least one model including a visual representation of a determined location where the collision occurred, the visual representation of the determined location based in part on map data retrieved from the memory device and a visual representation of the vehicle involved in the collision; and/or (ii) display a second display area wherein the second display area is programmed to display at least one data table corresponding to the at least one model, the at least one data table including telematics data regarding the vehicle involved in the collision, wherein movement of the visual representation of the vehicle on the GUI during a simulation of the at least one model is controlled at least by the telematics data, and wherein the GUI is configured to receive user inputs such that the visual representations in the first display area and the at least one data table in the second display area are dynamically modifiable by a user. The computer-readable storage media may include additional, less, or alternate actions, including those discussed elsewhere herein.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

BRIEF DESCRIPTION OF THE DRAWINGS

The Figures described below depict various aspects of the systems and methods disclosed therein. It should be understood that each Figure depicts an embodiment of a particular aspect of the disclosed systems and methods, and that each of the Figures is intended to accord with a possible embodiment thereof. Further, wherever possible, the following description refers to the reference numerals included in the following Figures, in which features depicted in multiple Figures are designated with consistent reference numerals.

There are shown in the drawings arrangements which are presently discussed, it being understood, however, that the present embodiments are not limited to the precise arrangements and are instrumentalities shown, wherein.

Figure 1:
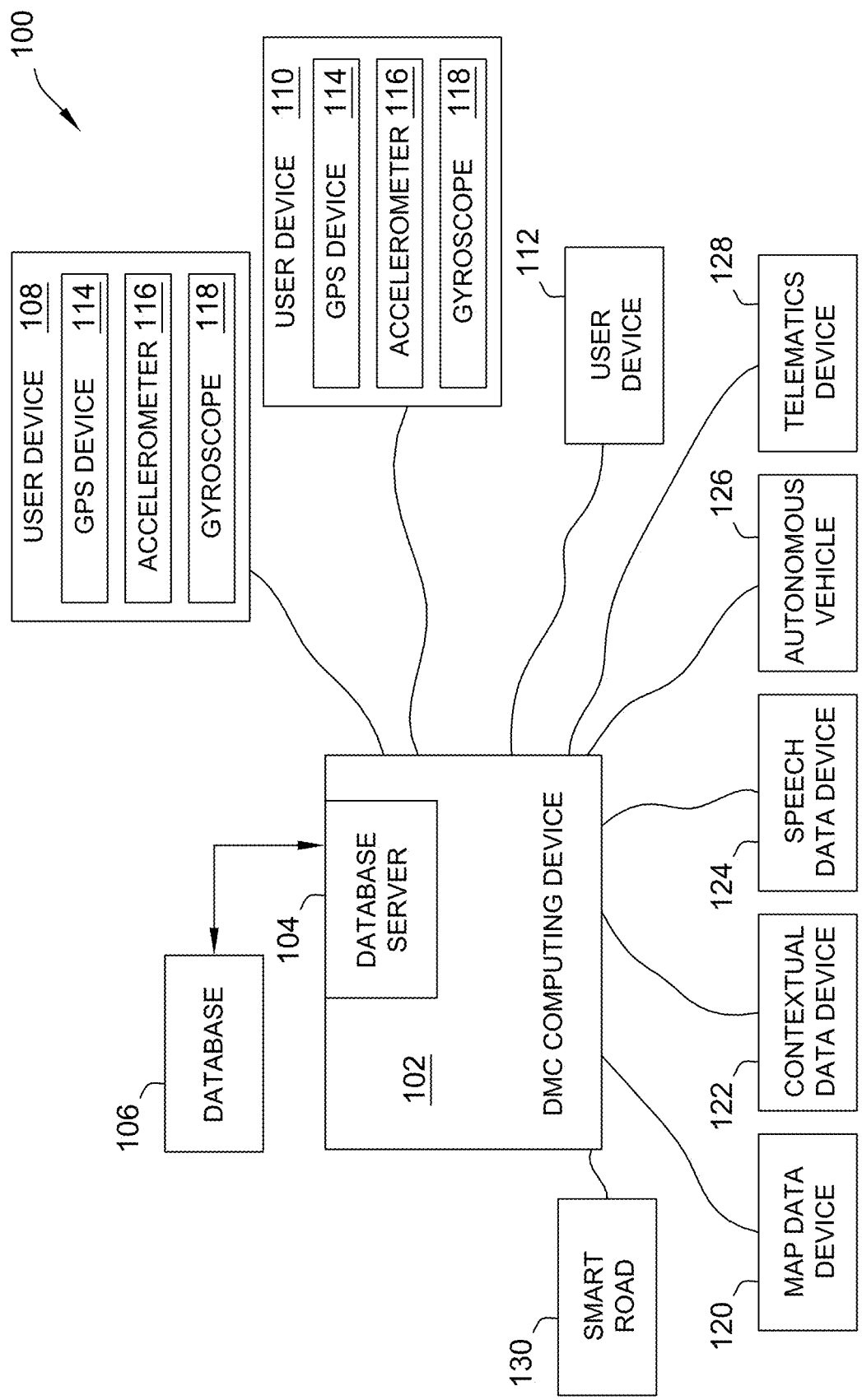
FIG. 1 illustrates an exemplary modeling system in accordance with an exemplary embodiment of the present disclosure.

The Figures depict preferred embodiments for purposes of illustration only. One skilled in the art will readily recognize from the following discussion that alternative embodiments of the systems and methods illustrated herein may be employed without departing from the principles of the invention described herein.

DETAILED DESCRIPTION OF THE DRAWINGS

The present embodiments may relate to, inter alia, systems and methods for analyzing collected data to dynamically create and adjust scene models. The disclosed systems and methods may include generating a model of a scene of a vehicle collision based upon a variety of collected data, as described herein. The disclosed systems may also include generating a modeled simulation of the vehicle collision based upon speech data from a witness (e.g., a driver, an eyewitness, etc.) account of the collision. The modeled simulation may, additionally or alternatively, be based upon vehicle telematics data retrieved from a vehicle involved in the collision. In the exemplary embodiment, the process may be performed by a dynamic model creation ("DMC") computing device.

In general, the present embodiments may also relate to, inter alia, a solution that may take into consideration both (i) data, such as sensor, image, or audio data, collected from other reliable sources (e.g., vehicles, smart vehicles, autonomous vehicles, aerial vehicles (e.g., drones), smart infrastructure, smart homes, and mobile devices, as well as geolocation data and scene photos/videos and vehicle damage photos), and (ii) driver accounts (e.g., acquired when an insurance representative interviews a driver). In some embodiments, the driver (or passenger, such as in the case of an autonomous vehicle) accounts or input may be acquired after the data collected from the other reliable sources is analyzed and synthesized to create a virtual collision reconstruction for use during the conversation with the driver (or passenger). The initial virtual collision reconstruction created with data obtained from the other reliable sources may then be verified and/or adjusted if need be by the driver (or passenger) accounts or other input. Alternatively, the initial virtual reconstruction may be created based upon driver (or passenger) accounts or other input, and then verified or adjusted if need based upon and/or by using the data collected from the other reliable sources.

As described below, the systems and methods described herein also may generate a model of a vehicle collision. By so doing, the systems and methods enable a determination of the events leading to the vehicle collision. Further, the systems and methods may verify eyewitness accounts of the vehicle collision, and may enable a determination of the cause of the vehicle collision. This may enable, for example, an efficient and accurate determination of liability and processing of insurance claims related to the vehicle collision.

Further, the systems and methods described herein allow for different parties to create a scene model specific to their account of a collision. For example, a claims associate may generate a first model based upon driver and/or eyewitness accounts of a collision (or alternatively, generate a first model based upon data collected from the other reliable sources mentioned herein). In some embodiments, the DMC computing device may generate a first model based upon data gathered regarding a collision, as described in detail herein. Once a first model is created, different parties (e.g., a first driver and a second driver) may have access to the first model, and be able to modify the model to more accurately represent their account of a collision scene. Accordingly, any number of models may be generated and stored for a single collision. Thus, as an example, for a single collision, the DMC computing device may generate and store a scene model for a claims associate, a first driver, and a second driver (or a first and second passenger), such that each party has access to, can adjust, and can share their scene model for any number of reasons (e.g., as a visual representation of their specific account of a collision in potential subrogation after a claim is filed). In some embodiments, the DMC computing device may be configured to analyze a plurality of scene models and/or identify discrepancies between the scene models.

In some embodiments, the DMC computing device may be configured to generate a most-likely scene model (e.g., representing a high probability of accuracy) based upon at least one of data gathered regarding a collision and/or driver (or passenger) accounts of an accident. As an example, the DMC computing device may give more weight to telematics data gathered from a vehicle than a driver account of a collision, wherein the telematics data indicates a first speed of the vehicle and the driver account indicates a different speed of the vehicle (e.g., because the gathered telematics data may be more reliable than a driver recollection of a speed of a vehicle). It is realized herein that any gathered data may be given more or less weight (e.g., assigned probability of accuracy) by DMC computing device when generating a scene model, and the above example is merely a single example.

Retrieving Data to Generate a Dynamic Scene Model

The DMC computing device may be configured to retrieve data to generate a model. For example, the DMC computing device may retrieve map data.

As used herein, "map data" may refer to any data identifying geographic features associated with the scene of the collision. Examples of map data include, but are not limited to, the locations of vehicle thoroughfares (e.g., streets, roads, or highways), sidewalks, railroads, water features, structures (e.g., buildings, fences, guard rails, or walls), terrain and/or topographical features (e.g., hills), and/or objects (e.g., foliage, road signs, or utility poles). Map data may also include information regarding specific vehicle thoroughfares, for example, a number of lanes, a direction of travel of each lane, road-specific traffic regulations (e.g., speed limits, school zones, or weight limits), presence of regulatory signs and signals (e.g., lane markings, railroad crossing gates, stop signs, or traffic signals), road dimensions (e.g., width of the lanes), road features (e.g., the presence and type of medians or barriers, the material and condition of road surfaces, or the presence of bridges and tunnels), and/or road topography (e.g., inclines in the road).

The DMC computing device may retrieve map data, for example, from a map database that is updated periodically. For example, the DMC computing device may receive updated map data from a map data computing device, and store the updated map data in the database. The DMC computing device may retrieve map data for each collision analyzed by the DMC computing device, enabling the DMC computing device to generate the model using up-to-date map information.

The DMC computing device may further retrieve contextual data. As used herein, "contextual data" may refer to any data identifying conditions at the scene of the collision at the time of the collision. Examples of contextual data include, but are not limited to, weather conditions, daylight or nighttime, traffic conditions (e.g., ambient traffic speed), construction, locations of vehicles, and/or current road conditions (e.g., lane closures, reduced speed limits, obstructions, or the presence of water).

The DMC computing device may retrieve contextual data, for example, from a contextual conditions database that is updated continuously or periodically. For example, the DMC computing device may receive updated contextual data from a contextual data computing device and store the updated contextual data in the database. In embodiments where at least some of the vehicles at the scene include sensors (e.g., smart vehicles, autonomous vehicles, and/or vehicles equipped with telematics devices), the contextual data may include vehicle telematics data, for example, to determine positions and orientations of the vehicles along with positions and orientations of other property and/or persons at the time of the accident.

In some embodiments, the DMC computing device may retrieve additional data from vehicles that may provide information about the context of the collision, such as data obtained from video cameras and/or other sensors onboard the vehicle. For example, for a vehicle where the headlights and windshield wipers are controlled based upon sensor input, the DMC computing device may determine, based upon data indicating activation of headlights or windshield wipers, that conditions were dark or rainy, respectively. In some embodiments, the DMC computing device may further retrieve contextual data from video cameras and/or sensors that are not onboard the vehicle, such as surveillance cameras and/or sensors associated with a smart street system.

The DMC computing device may further retrieve vehicle specification data. As used herein, "vehicle specification data" includes any data related to characteristics of specific models of vehicles. For example, vehicle specification data may include crumple zones, mass (e.g., gross weight), dimensions, power, braking, traction, and other such characteristics of the vehicle. The DMC computing device may use vehicle specification data to accurately depict the vehicles in the model and ensure that behavior of the vehicles when the model is simulated corresponds to a physically possible scenario.

The DMC computing device may further retrieve photographic data. As used herein, "photographic data" includes photographs and any data associated with the photographs (e.g., time stamps or geographic coordinates). For example, photographic data may include photographs taken of the scene of the collision and of damage to the vehicles. Photographs of the scene of the collision may include, for example, the final resting positions of the vehicles following the collision. Photographic data may further include video taken by cameras onboard the vehicle or cameras having a view of the scene of the collision (e.g., surveillance cameras).

The DMC computing device may further retrieve text data. As used herein, "text data" includes text (e.g., text documents). For example, text data may include documents describing the collision (e.g., a police report). The DMC computing device may parse text data for terms and phrases indicative of the behavior of the vehicles in the collision.

The DMC computing device may further retrieve physics data. As used herein, "physics data" includes any data that describes physical interactions such as physical rules (e.g., laws of physics). The physical rules may be applied to other data, (e.g., map data, contextual data, and vehicle specification data) to determine physical constraints for the simulation corresponding to realistic physics of the collision.

Analyzing Speech Data

The DMC computing device may be further configured to receive, parse, and analyze speech data. The speech data may correspond to an eyewitness account of the collision (e.g., a claims statement to an insurance representative). The DMC computing device may use the speech data, for example, to generate and/or modify a model of the collision. The DMC computing device may further analyze the speech data, for example, to determine the accuracy of a statement represented by the speech data.

The DMC computing device may receive the speech data, for instance, from a speech data computing device associated with an insurance company receiving a claim. For example, the DMC computing device may receive an audio signal of a phone call including an eyewitness account from the speech data computing device. The DMC computing device may detect speech in the audio signal and automatically transcribe the speech into text in real time (e.g., during the phone call). The DMC computing device may further display the text in real time. The text may be used by the DMC computing device and/or individuals conducting vehicle forensics in analyzing the collision.

The DMC computing device may be further configured to parse the speech data to identify terms and phrases describing the collision. For example, the DMC computing device may parse the speech data for phrases indicating descriptions of movement (e.g., acceleration, speed, and direction), actions taken by the drivers (e.g., applying the brakes), descriptions of the collision (e.g., points of contact of the vehicles), and/or other information regarding the circumstances (e.g., information regarding compliance with traffic signs and/or signals). For each phrase, the DMC computing device may determine a moment in time with respect to the collision the phrase corresponds, for example, by analyzing the phrase's relative position within the statement (e.g., closer to the beginning or end of the statement) or by detecting phrases indicating sequence (e.g., first, next, then, etc.).

The DMC computing device may determine the meaning of the descriptive phrases with respect to the collision to construct a sequence of events of the collision. The sequence of events may include, for example, the movement, positions, and orientations of vehicles, other property, and/or persons at different moments in time during the collision. The DMC computing device may determine the meaning of phrases, for example, by looking up the phrases in a database. In certain embodiments, the DMC computing device may utilize machine learning to determine the meaning of phrases and construct the phrases into a sequence of events. Identifying phrases that describe the collision and determining their meaning enables the collision to be simulated.

Parsing the speech data further enables the DMC computing device to verify the accuracy and/or validity of the eyewitness account in real time by identifying inconsistent statements. For example, the DMC computing device may determine a driver's statement that he or she entered an intersection at a high rate of speed yet still stopped before crossing the intersection is inconsistent or physically impossible to have occurred the way described. In addition, the DMC computing device may compare statements to known telematics data, and/or any other data described herein, for consistency (e.g., a driver's statement that it was raining during the collision versus collected data indicating it was sunny). The DMC computing device may flag such inconsistent statements to alert an insurance representative, as an example. The DMC computing device may also reduce the weight such inconsistent statements are given when generating a model. In some embodiments, the DMC computing device may utilize machine learning to identify conflicting statements and verify the accuracy and/or validity of witness accounts.

Generating a Model to Simulate a Vehicular Accident

The DMC computing device is further configured to generate a model of the collision. The model may include, for example, a position and an orientation of each vehicle involved in the collision at a plurality of moments of time during the traffic collision along with positions and orientations of other property and/or persons. The DMC computing device may generate a series of representations of the scene of the accident corresponding to each of the plurality of moments of time and including the position and orientation of each vehicle along with positions and orientations of other property and/or persons. The DMC computing device may display the series of representations in sequence to illustrate/simulate the modeled collision.

The model may thus be simulated and displayed to illustrate the collision and its context, enabling an individual who was not at the scene of the collision to comprehend and analyze the collision. Further, the model may be simulated and displayed to an eyewitness in order for the eyewitness to verify the simulation of the model accurately represents their account of how the collision occurred. In some embodiments, a user may be able to modify a model generated by the DMC computing device in order for the model to better represent their account of how the collision occurred (e.g., by modifying objects shown in the model and/or parameters in a data table, as described herein).

The DMC computing device may generate the model to depict the scene of the collision. The model may be based upon, for example, map data and contextual data and enables individuals not present at the scene of the collision (e.g., insurance claims employees) to visualize the scene.

To generate the scene model, the DMC computing device may, for example, compile map data into a format that enables the DMC computing device to display a visual representation of the scene of the collision. The DMC computing device may compile data representing the road itself (e.g., the width of the road, the number of lanes, the terrain, etc.). The DMC computing device may further compile data representing a vicinity of the collision (e.g., the locations of structures and objects near the location).

To generate the scene model, the DMC computing device may compile contextual data into a format that enables the DMC computing device to display contextual conditions in the scene model. For example, the visual representation may include a representation of weather, construction, or the presence of traffic at the scene of the collision. In embodiments where the positions of specific vehicles are available, the visual representation may include representations of the specific vehicles at their respective locations. Such a visual representation enables an individual remote from and/or unfamiliar with the scene of the collision to understand the context of the collision. For example, the individual conducting the claim analysis may familiarize himself or herself with the scene prior to hearing eyewitness accounts of the collision to better be able to interpret and/or verify the accuracy of the eyewitness accounts.

To simulate the modeled collision, the DMC computing device may determine the position and orientation of one or more vehicles along with the position and orientation of other property and/or persons involved in the collision for a plurality of moments in time during the collision. The DMC computing device may model the collision based upon, for example, speech data and/or vehicle telematics data. The DMC computing device may further use additional data to model the collision (e.g., vehicle specification data, photographic data, text data, and/or physics data).

The DMC computing device may determine the position and orientation of the vehicle along with the position and orientation of other property and/or persons based upon the speech data. The DMC computing device may use speech data to determine the positions and orientations of the vehicles along with the position and orientation of other property and/or persons involved in the collision. For example, the DMC computing device may interpret phrases indicating the relative positions of vehicles to determine the behavior of the vehicles during the collision. The DMC computing device may further interpret phrases indicating motion (e.g., direction of travel, speed, acceleration, etc.) and contact (e.g., parts of vehicles and/or objects that came into contact during the collision) to infer the positions and orientations of vehicles along with the position and orientation of other property and/or persons during the collision. In certain embodiments, the DMC computing device may utilize machine learning techniques to develop a machine-learning model for accurately modeling a collision based upon speech data.

Based upon the speech data, the DMC computing device may generate visual representations of vehicles, property, and/or persons involved in the accident based upon the determined positions and orientations of the vehicles, property, and/or persons over the course of the collision. For example, the visual representations may appear to move and come into contact in a manner as described in the speech data. To generate the simulation using speech data, the DMC computing device may disregard speech data that the DMC computing device determines to be conflicting. Thus, the simulation of the model may conform as close as possible to an eyewitness statement while maintaining a physically accurate depiction of the collision.

Additionally or alternatively, the DMC computing device may determine the position and orientation of the vehicle along with the position and orientation of other property and/or persons based upon vehicle telematics data. Vehicle telematics data includes data retrieved from a sensor-equipped vehicle involved in the collision (e.g., an autonomous vehicle (AV) or smart vehicle) or a device onboard a vehicle involved in the collision (e.g., a mobile phone device or a telematics device installed by an insurance company). Vehicle telematics data may include data derived from, for example, an accelerometer, gyroscope, or GPS device, and indicate the position, yaw, speed, acceleration, deceleration, braking, cornering, and other characteristics of the vehicle's motion and orientation. Such vehicle telematics data may be used by the DMC computing device to determine the behavior of the vehicle from which it is derived during the collision. To generate the model, the DMC computing device may generate a representation of the vehicle from which the vehicle telematics data was received that behaves in accordance with the telematics data (e.g., the simulated vehicle appears to move and change orientation in accordance with the telematics data). The simulation of the model thus reflects the actual behavior of the vehicle in the collision and enables analysis of the collision even in cases where no eyewitnesses are available or present at the scene of the collision.

The DMC computing device may further determine the position and orientation of the vehicle along with the position and orientation of other property and/or persons based upon vehicle specification data. The DMC computing device may use vehicle specification data to accurately depict the vehicles in the model and ensure that behavior of the vehicles in the situation corresponds to a physically possible scenario. For example, the DMC computing device may simulate the modeled collision such that simulated representation of a vehicle does not outperform the actual capabilities of the vehicle (e.g., by accelerating and decelerating as an actual vehicle with the same specifications could) and behaves realistically when coming into simulated contact with other representations of vehicles or objects (e.g., by appearing to move and deform as an actual vehicle having the same specifications would).

The DMC computing device may further determine the position and orientation of the vehicle along with the position and orientation of other property and/or persons based upon photographic data. For example, photographic data may include photographs taken of the scene of the collision and of damage to the vehicles. Photographs of the scene of the collision may include, for example, the final resting positions of the vehicles following the collision. Photographic data may further include video taken by cameras onboard the vehicle or cameras having a view of the scene of the collision (e.g. surveillance cameras).

The DMC computing device may generate the model so that the position and orientation of representations of the vehicles along with the position and orientation of other property and/or persons corresponds to the positions of the vehicles along with the position and orientation of other property and/or persons in photographs and/or of the scene at the moment depicted by the photograph and/or video. Photographs of damage to the vehicles may indicate points of contact (e.g., points of damage indicating contact between two vehicles or between vehicles and objects) during the collision. The DMC computing device may generate the model so that the points of contact in the simulated collision correspond to points of contact indicated by the photographs.

The DMC computing device may further determine the position and orientation of the vehicle along with the position and orientation of other property and/or persons based upon text data. For example, text data may include documents describing the collision (e.g., a police report). The DMC computing device may parse text data for terms and phrases indicative of the behavior of the vehicles in the collision. The DMC computing device may utilize the parsed text data to determine the positions and orientations of vehicles along with the position and orientation of other property and/or persons during the course of the collision.

The DMC computing device may further determine the position and orientation of the vehicle along with the position and orientation of other property and/or persons based upon physics data. The DMC computing device may apply physics data to other data, (e.g., map data, contextual data, and vehicle specification data) to determine physical constraints for the simulation corresponding to realistic physics of the collision. For example, the DMC computing device may apply information regarding the coefficient of friction of the road surface and the mass of a vehicle to determine a maximum capability of the vehicle to decelerate. If, for example, speech data indicates that the vehicle decelerated at a faster rate than is physically possible, the DMC computing device may disregard the conflicting speech data when generating the model of the collision. The simulation of the model thus may more accurately reflect the actual behavior of the vehicle in the collision.

At least one of the technical problems addressed by this system may include: (i) the inability of a computing device to determine a geographic location of a vehicle collision using vehicle sensor data and mobile device sensor data; (ii) the inability of a computer to accurately display a model of a scene of a vehicle collision to a user remote from the scene based upon certain limited inputted data; (iii) the inability of a computing device to interpret speech describing a vehicle collision and translate that speech into a visual model; (iv) the inefficiency in verifying the accuracy of an eyewitness account of a vehicle collision; (v) the inability to generate a computer model of a vehicle collision based upon speech data; (vi) the inability to generate a computer model of a vehicle collision without eyewitnesses; (vii) the inability to generate different models of a vehicle collision based upon different parties' accounts of the collision; (viii) the inability to save different models of a vehicle collision and determine a most-likely model of the vehicle collision based upon known data (e.g., data gathered from sensors, cameras, etc.) versus data gathered from testimony; (ix) the inability for users to input information into a system to update a vehicle collision model; (x) the inability to indicate inconsistencies amongst multiple models created for the same vehicle collision; and/or (xi) the inability to analyze historical vehicle collision data to create a model of a present vehicle collision.

A technical effect of the systems and processes described herein may be achieved by performing at least one of the following steps: (i) analyzing a statement from a witness of a collision involving a vehicle to generate speech data; (ii) retrieving map data associated with a determined location of the collision; (iii) determining, based at least upon the analysis of the speech data, for a plurality of moments in time during the collision, a position and an orientation of the vehicle; (iv) generating a first model including a representation of the vehicle involved in the collision based upon the map data and the determined position and orientation of the vehicle for the plurality of moments in time; (v) causing display of the first model on a graphical user interface (GUI) of a user computing device associated with the witness; (vi) receiving, from the user computing device, at least one input signal generated by the user computing device in response to an input at the GUI; (vii) generating an updated model based upon the first model and the at least one input signal; (viii) displaying a first display area wherein the first display area is programmed to display the at least one model including a visual representation of a determined location where the collision occurred, the visual representation of the determined location based in part on map data retrieved from the database and a visual representation of the vehicle involved in the collision; and/or (ix) displaying a second display area wherein the second display area is programmed to display at least one data table corresponding to the at least one model, the at least one data table including telematics data regarding the vehicle involved in the collision wherein movement of the visual representation of the vehicle on the GUI during a simulation of the at least one model is controlled at least by the telematics data; and wherein the GUI is configured to receive user inputs such that the visual representations in the first display area and the at least one data table in the second display area are dynamically modifiable by a user.

The technical effect achieved by this system may be at least one of: (i) ability of a computing device to determine a geographic location of a vehicle collision using vehicle sensor data and mobile device sensor data; (ii) ability of a computer to accurately display a model of a scene of a vehicle collision to a user remote from the scene based upon certain limited inputted data; (iii) ability of a computing device to interpret speech describing a vehicle collision and translate that speech into a visual model; (iv) efficiently verify the accuracy of an eyewitness account of a vehicle collision; (v) ability to generate a computer model of a vehicle collision based upon speech data; (vi) ability to generate a computer model of a vehicle collision without eyewitnesses; (vii) ability to generate different models of a vehicle collision based upon different parties' accounts of the collision; (viii) ability to save different models of a vehicle collision and determine a most-likely model of the vehicle collision based upon known data (e.g., data gathered from sensors, cameras, etc.) versus data gathered from testimony; (ix) ability for users to input information into a system to update a vehicle collision model; (x) ability to indicate inconsistencies amongst multiple models created for the same vehicle collision; and/or (xi) ability to analyze historical vehicle collision data to create a model of a present vehicle collision.

Exemplary Vehicle Forensics System

FIG. 1 depicts an exemplary modeling computing system 100. Modeling computing system 100 may include a dynamic model creation computing device 102 (also referred to herein as DMC computing device). DMC computing device 102 may include a database server 104. Further, DMC computing device 102 may be in communication with, for example, a database 106, one or more user devices 108 and 110, each including a GPS 114, an accelerometer 116, and a gyroscope 118, a client computing device, such as user device 112, a map data computing device 120, a contextual data computing device 122, a speech data computing device 124, an autonomous vehicle (AV) 126, a telematics device 128, and/or a smart road system 130.

In some embodiments, DMC computing device 102 may determine a time and location of a vehicle collision. The determined time and location enable DMC computing device 102 to generate a contextually accurate model that simulates the collision. DMC computing device 102 may determine the time and the location, for example, by retrieving and analyzing time data (e.g., a timestamp) and location data (e.g., geographic coordinates).

In some exemplary embodiments, DMC computing device 102 may retrieve the location data by detecting the vehicle collision. Some vehicles, such as autonomous vehicles (e.g., AV 126), are equipped with an automated driving system (ADS) that includes a plurality of sensors that may be used to detect a collision (e.g., see FIG. 4). Such sensors may generate, for example, vehicle telematics data. Additionally or alternatively, a separate device onboard the vehicle may generate vehicle telematics data. For example, user devices 108 and 110 (e.g., a mobile phone device) and/or telematics device 128 (e.g., a telematics device installed in the vehicle by an insurance company) may generate vehicle telematics data.

DMC computing device 102 may receive the vehicle telematics data, for example, through a WLAN-based or cellular-based vehicular communication system. DMC computing device 102 may determine, for example, that a rapid change in the acceleration, deceleration, and/or yaw of the vehicle (e.g., AV 126) indicates that a vehicle collision occurred at the time of the rapid change and identify the time of the rapid change as the time of the collision. DMC computing device 102 may further identify the location of the collision using geographic coordinates of the vehicle at the time of the rapid change, for example, based upon data retrieved from a global positioning system (GPS) device present onboard the vehicle.

In some exemplary embodiments, DMC computing device 102 may retrieve the time and location from user device 108, 110, which may be, for example, a GPS-equipped mobile phone device. For example, an individual involved in the collision may contact his or her insurer to make an insurance claim, for example, by calling an insurance representative (e.g., at user device 112) with user device 108, 110 and/or by submitting the claim using a mobile application installed on user device 108, 110. Based upon the call and/or the submission through the mobile application, DMC computing device 102 may determine that an accident has occurred and record a time the call and/or submission was made (e.g., a timestamp). DMC computing device 102 may further retrieve the geographic coordinates of user device 108, 110. DMC computing device 102 may identify the timestamp and retrieved geographic coordinates as the time and location of the collision.

In some exemplary embodiments, DMC computing device 102 may retrieve the time and location of the collision from a third party. For example, a police report may include the geographic coordinates of a collision. DMC computing device 102 may retrieve a third party document such as a police report and parse the document for data regarding the time and the location of the collision (e.g., the geographic coordinates). DMC computing device 102 may identify the time and the location based upon the parsed data.

In some embodiments, DMC computing device 102 may receive the time and location of the collision from user computing device 112 based upon, for example, inputs from an insurance representative. For example, before conducting an eyewitness interview, the claims associate may input a known time and/or location of the collision. Accordingly, DMC computing device 102 may retrieve data, such as map data from map data device 120, to generate a model including a map of the location at the time of the collision. In some embodiments, during the interview, the insurance representative may modify the model according to the eyewitness account (e.g., by adding/removing objects and/or entering data, such as telematics data, into the model based upon inputs received at user computing device 112 and transmitted to DMC computing device 102). In some embodiments, the eyewitness may modify the model during the interview (e.g., the model is updated and transmitted to user computing device 108 of the eyewitness and user computing device 112 of the claims associate during the interview, so that the eyewitness and claims associate may view and/or update the model as the interview progresses).

DMC computing device 102 may be further configured to retrieve data to generate the dynamic scene model. DMC computing device 102 may retrieve, for example, map data, contextual data, vehicle specification data, photographic data, text data, and physics data.

DMC computing device 102 may retrieve map data, for example, from database 106. For example, DMC computing device may receive updated map data from a map data computing device 120 and store the updated map data in the database 106. DMC computing device 102 may retrieve map data for each collision analyzed by DMC computing device 102, enabling DMC computing device 102 to generate the dynamic scene model using up-to-date map information.

DMC computing device 102 may retrieve contextual data, for example, from database 106 that is updated continuously or periodically. For example, DMC computing device 102 may receive updated contextual data from a contextual data computing device 124 and store the updated contextual data in the database 106. In embodiments where at least some of the vehicles at the scene include sensors (e.g., AV 126 and/or a vehicle equipped with telematics device 128), the contextual data may include vehicle telematics data, for example, to determine positions and orientations of the vehicles along with the position and orientation of other property and/or persons at the time of the accident.

In some embodiments, DMC computing device 102 may retrieve additional data from vehicles (e.g., AV 126) that may provide information about the context of the collision, such as data obtained from video cameras and/or other sensors onboard the vehicle. For example, if headlights and windshield wipers of AV 126 are controlled based upon sensor input, DMC computing device 102 may determine, based upon data indicating activation of headlights or windshield wipers of AV 126, that conditions were dark or rainy, respectively. In some embodiments, DMC computing device 102 may further retrieve contextual data from video cameras and/or sensors that are not onboard the vehicle, such as surveillance cameras and/or sensors associated with smart road system 130 (e.g., a road including fibers that detect vehicular position, speed and/or weight).

In the exemplary embodiment, DMC computing device 102 may be further configured to retrieve, parse, and analyze speech data. The speech data may correspond to an eyewitness account of the collision (e.g., a claims statement to an insurance representative). DMC computing device 102 may use the speech data, for example, to generate a dynamic scene model of the collision. DMC computing device 102 may further analyze the speech data, for example, to determine the accuracy of a statement represented by the speech data.

DMC computing device 102 may receive the speech data, for example, from speech data computing device 124. Speech data computing device 124 may be associated with, for example, an insurance company receiving a claim. For example, DMC computing device 102 may receive an audio signal of a phone call including an eyewitness account from speech data computing device 124. DMC computing device 102 may detect speech in the audio signal and automatically transcribe the speech into text in real time (e.g., during the phone call). DMC computing device 102 may further display the text in real time. The text may be used by DMC computing device 102 and/or individuals involved in the claims process for the particular collision.

DMC computing device 102 may further parse the speech data to identify terms and phrases describing the collision. For example, DMC computing device 102 may parse the speech data for phrases indicating descriptions of movement (e.g., acceleration, speed, and direction), actions taken by the drivers (e.g., applying the brakes), descriptions of the collision (e.g., points of contact of the vehicles), and/or other information regarding the circumstances (e.g., information regarding compliance with traffic signs and/or signals). For each phrase, DMC computing device 102 may determine a moment in time with respect to the collision the phrase corresponds, for example, by analyzing the phrase's relative position within the statement (e.g., closer to the beginning or end of the statement) or by detecting phrases indicating sequence, (e.g., first, next, then, etc.).

DMC computing device 102 may determine the meaning of the descriptive phrases with respect to the collision to construct a sequence of events of the collision. The sequence of events may include, for example, the movement, positions, and orientations of vehicles along with the position and orientation of other property and/or persons at different moments in time during the collision. DMC computing device 102 may determine the meaning of phrases, for example, by looking up the phrases comparing the phrases to, for example, tables stored in database 106. In certain embodiments, DMC computing device 102 may utilize machine learning to determine the meaning of phrases and construct the phrases into a sequence of events. Identifying phrases that describe the collision and determining their meaning enables the collision to be modeled and simulated.

Parsing the speech data further enables DMC computing device 102 to verify the accuracy and/or validity of the eyewitness account in real time by identifying inconsistent statements. For example, DMC computing device 102 may determine a driver's statement that he or she entered an intersection at a high rate of speed yet still stopped before crossing the intersection is inconsistent. In addition, DMC computing device 102 may compare statements to known map data or contextual data for consistency (e.g., a driver's statement that it was raining during the collision versus contextual data indicating it was sunny). DMC computing device 102 may flag such inconsistent statements to alert individuals conducting vehicle forensics. In some embodiments, DMC computing device 102 may utilize machine learning to identify conflicting statements and verify the accuracy and/or validity of witness accounts.

In the exemplary embodiment, DMC computing device 102 is further configured to generate at least one dynamic scene model of the collision. The model may include, for example, a position and an orientation of each vehicle along with the position and orientation of other property and/or persons involved in the collision at a plurality of moments of time during the traffic collision. DMC computing device 102 may generate a series of representations of the scene of the accident corresponding to each of the plurality of moments of time and including the position and orientation of each vehicle along with the position and orientation of other property and/or persons. DMC computing device 102 may display the series of representations in sequence to illustrate the simulated collision. The dynamic scene model may thus be displayed to illustrate the collision and its context, enabling an individual who was not at the scene of the collision to comprehend and analyze the collision.

Further, dynamic scene models are updateable in real time by a user, for examples at one of user computing devices 108, 110, and 112. For example, DMC computing device 102 may generate a dynamic scene model based upon a statement given by a driver (or passenger), as described above. The dynamic scene model may then be transmitted from DMC computing device 102 to user computing device 108 of the driver who gave the statement. Then, at user computing device 108, the driver may update the dynamic scene model to correct any discrepancies the driver identifies in the model. Examples of changes a user may make to a dynamic scene model may include adding/removing vehicles (e.g., as explained in further detail with respect to FIG. 6) and/or modifying data included in at least one data table displayed in the dynamic scene model (e.g., as explained in further detail with respect to FIG. 7). DMC computing device 102 may be configured to dynamically update the dynamic scene model in real time as a user edits the model at a GUI one of user computing devices 108, 110, and 112, and save an updated copy of the model at database 106.

In the exemplary embodiment, DMC computing device 102 may be configured to generate a dynamic scene model based upon verified data (e.g., data received from map data 120, contextual data device 122, autonomous vehicle 126, telematics device 128, and/or smart road system 130). DMC computing device 102 may be further configured to generate the dynamic scene model based upon driver statements to fill in any gaps left based upon the verified data. For example, DMC computing device 102 may not receive all data necessary to generate a complete dynamic scene model (e.g., no verified data is received for one vehicle involved in an accident). In such embodiments, DMC computing device 102 may be configured to gather any further data needed to create a dynamic scene model from speech data as described herein.

In other words, DMC computing device 102 may be configured to generate a scene model based upon gathered verified data, and then complete the model by filling in any gaps left by the verified data with speech data gathered from at least one driver account of the accident. Accordingly, DMC computing device 102 may generate a highly-accurate dynamic scene model by first analyzing verified data and then, to the extent the verified data may be incomplete, completing the model by analyzing speech data from at least one driver account of the accident.

As described herein, more than one dynamic scene model may be saved by DMC computing device 102 at database 106 for the same accident. As examples, one model may be saved based upon DMC computing device 102 analyzing at least one statement from at least one driver (or passenger). A second model may include modifications to the first model based upon inputs from an insurance representative received at user device 112. A third model may include modifications to the first model based upon inputs from a first driver received at user device 108. A fourth model may include modifications to the first model based upon inputs from a second driver received at user device 110.

Thus, any number of dynamic scene models may be generated by DMC computing device 102 for a single accident. Accordingly, as the claims process progresses, each party involved may access a dynamic scene model specific to their account of how the accident occurred.

DMC computing device 102 may generate a simulation including a scene model depicting the scene of the collision. The scene model may be based upon, for example, map data and contextual data and enables individuals not present at the scene of the collision (e.g., insurance claims employees) to visualize the scene.

To generate the scene model, DMC computing device 102 may, for example, compile map data into a format that enables DMC computing device 102 to display a visual representation of the scene of the collision. DMC computing device 102 may compile data representing the road itself (e.g., the width of the road, the number of lanes, the terrain, etc.). DMC computing device 102 may further compile data representing a vicinity of the collision (e.g., the locations of structures and objects near the location).

To generate the scene model, DMC computing device 102 may compile contextual data into a format that enables DMC computing device 102 to display contextual conditions in the scene model. For example, the visual representation may include a representation of weather, construction, or the presence of traffic at the scene of the collision. In embodiments where the positions of specific vehicles are available, the visual representation may include representations of the specific vehicles at their respective locations.

Such a visual representation enables an individual remote from and/or unfamiliar with the scene of the collision to understand the context of the collision. For example, an insurance representative may familiarize himself or herself with the scene prior to hearing eyewitness accounts of the collision to better be able to interpret and/or verify the accuracy of the eyewitness accounts during and/or after receiving eyewitness/driver accounts.

To simulate the modeled collision, DMC computing device 102 may determine the position and orientation of one or more vehicles along with the position and orientation of other property and/or persons involved in the collision for a plurality of moments in time during the collision. DMC computing device 102 may simulate the modeled collision based upon, for example, speech data and/or vehicle telematics data. DMC computing device 102 may further use additional data to model the collision (e.g., vehicle specification data, photographic data, text data, and/or physics data).

DMC computing device 102 may determine the position and orientation of the vehicle along with the position and orientation of other property and/or persons based upon the speech data. DMC computing device 102 may use speech data to determine the positions and orientations of the vehicles along with the position and orientation of other property and/or persons involved in the collision. For example, DMC computing device 102 may interpret phrases indicating the relative positions of vehicles to determine the behavior of the vehicles during the collision.

DMC computing device 102 may further interpret phrases indicating motion (e.g., direction of travel, speed, acceleration, etc.) and contact (e.g., parts of vehicles and/or objects that came into contact during the collision) to infer the positions and orientations of vehicles along with the position and orientation of other property and/or persons during the collision. In certain embodiments, DMC computing device 102 may utilize machine learning techniques to develop a model for accurately simulating a collision based upon speech data.

Based upon the speech data, DMC computing device 102 may generate visual representations of vehicles involved in the accident based upon the determined positions and orientations of the vehicles along with the position and orientation of other property and/or persons over the course of the collision. For example, the visual representations may appear to move and come into contact in a manner as described in the speech data. To generate the model using speech data, DMC computing device 102 may disregard speech data that DMC computing device 102 determines to be conflicting (e.g., as described above with respect to verified data). Thus, the simulation may conform as close as possible to an eyewitness statement while maintaining a physically accurate depiction of the collision.

Additionally or alternatively, DMC computing device 102 may determine the position and orientation of the vehicle along with the position and orientation of other property and/or persons based upon vehicle telematics data. Vehicle telematics data includes data retrieved from a sensor-equipped vehicle involved in the collision (e.g., AV 126) or a device onboard a vehicle involved in the collision (e.g., telematics device 128). Vehicle telematics data may include data derived from, for example, an accelerometer, gyroscope, or GPS device, and indicate the position, yaw, speed, acceleration, deceleration, and other characteristics of the vehicle's motion and orientation. Such vehicle telematics data may be used by DMC computing device 102 to determine the behavior of the vehicle from which it is derived during the collision.

To generate the simulation, DMC computing device 102 may generate a representation of the vehicle from which the vehicle telematics data was received that behaves in accordance with the telematics data (e.g., the simulated vehicle appears to move and change orientation in accordance with the telematics data). The simulated model thus reflects the actual behavior of the vehicle in the collision and enables analysis of the collision even in cases where no eyewitnesses are available or present at the scene of the collision.

DMC computing device 102 may further determine the position and orientation of the vehicle along with the position and orientation of other property and/or persons based upon vehicle specification data. DMC computing device 102 may use vehicle specification data to accurately depict the vehicles in the simulation of the model and ensure that behavior of the vehicles in the situation corresponds to a physically possible scenario. For example, DMC computing device 102 may simulate the collision such that simulated representation of a vehicle does not outperform the actual capabilities of the vehicle (e.g., by accelerating and decelerating as an actual vehicle with the same specifications could) and behaves realistically when coming into simulated contact with other representations of vehicles or objects (e.g., by appearing to move and deform as an actual vehicle having the same specifications would).

DMC computing device 102 may further determine the position and orientation of the vehicle along with the position and orientation of other property and/or persons based upon photographic data. For example, photographic data may include photographs taken of the scene of the collision and of damage to the vehicles. Photographs of the scene of the collision may include, for example, the final resting positions of the vehicles following the collision. Photographic data may further include video taken by cameras onboard the vehicle or cameras having a view of the scene of the collision (e.g. surveillance cameras). DMC computing device 102 may generate the simulation of the model so that the position and orientation of representations of the vehicles along with the position and orientation of representations of other property and/or persons corresponds to the positions and orientations of the vehicles along with the position and orientation of other property and/or persons in photographs and/or of the scene at the moment depicted by the photograph and/or video. Photographs of damage to the vehicles may indicate points of contact (e.g., points of damage indicating contact between two vehicles or between vehicles and objects) during the collision. DMC computing device 102 may generate the simulation so that the points of contact in the simulated collision correspond to points of contact indicated by the photographs.

DMC computing device 102 may further determine the position and orientation of the vehicle along with the position and orientation of other property and/or persons based upon text data. For example, text data may include documents describing the collision (e.g., a police report). DMC computing device 102 may parse text data for terms and phrases indicative of the behavior of the vehicles in the collision. DMC computing device 102 may utilize the parsed text data to determine the positions and orientations of vehicles along with the position and orientation of other property and/or persons during the course of the collision.

DMC computing device 102 may further determine the position and orientation of the vehicle along with the position and orientation of other property and/or persons based upon physics data. DMC computing device 102 may apply physics data to other data, (e.g., map data, contextual data, and vehicle specification data) to determine physical constraints for the simulation of the model corresponding to realistic physics of the collision. For example, DMC computing device 102 may apply information regarding the coefficient of friction of the road surface and the mass of a vehicle to determine a maximum capability of the vehicle to decelerate. If, for example, speech data indicates that the vehicle decelerated at a faster rate than is physically possible, DMC computing device 102 may disregard the conflicting speech data when simulating the collision. The simulation thus may more accurately reflect the actual behavior of the vehicle in the collision.

Exemplary Client Computing Device

Figure 2:
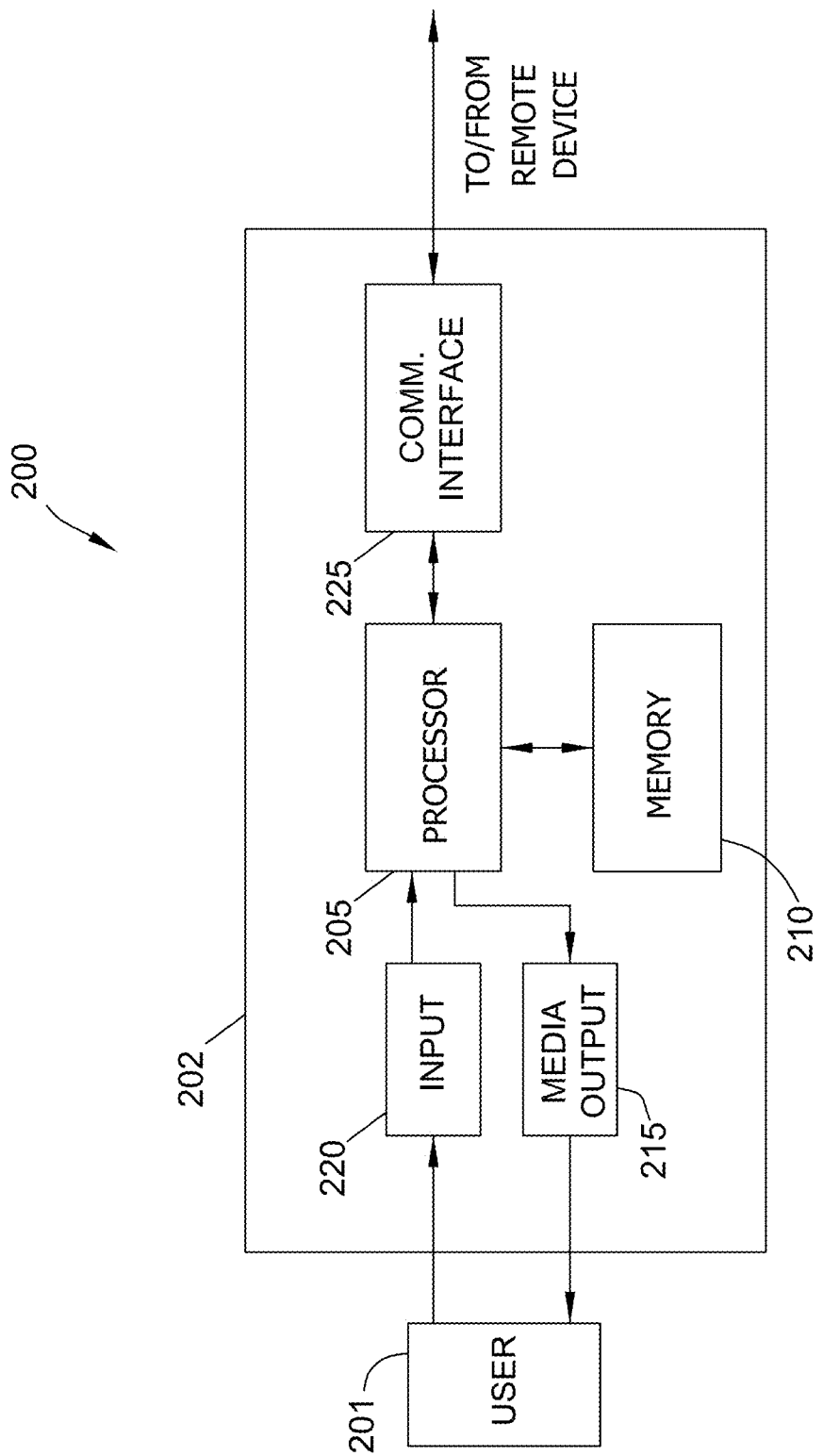
FIG. 2 illustrates an exemplary client computing device that may be used with the modeling system illustrated in FIG. 1.

FIG. 2 depicts an exemplary client computing device 202. Client computing device 202 may be, for example, at least one of map data computing device 120, contextual data computing device 122, speech data computing device 124, AV 126, user device 108, 110, 112, and/or telematics device 128 (all shown in FIG. 1).

Client computing device 202 may include a processor 205 for executing instructions. In some embodiments, executable instructions may be stored in a memory area 210. Processor 205 may include one or more processing units (e.g., in a multi-core configuration). Memory area 210 may be any device allowing information such as executable instructions and/or other data to be stored and retrieved. Memory area 210 may include one or more computer readable media.

In exemplary embodiments, client computing device 202 may also include at least one media output component 215 (e.g., a graphical user interface (GUI)) for presenting information to a user 201. Media output component 215 may be any component capable of conveying information to user 201. In some embodiments, media output component 215 may include an output adapter such as a video adapter and/or an audio adapter. An output adapter may be operatively coupled to processor 205 and operatively couplable to an output device such as a display device (e.g., a liquid crystal display (LCD), light emitting diode (LED) display, organic light emitting diode (OLED) display, cathode ray tube (CRT) display, "electronic ink" display, or a projected display) or an audio output device (e.g., a speaker or headphones).

Client computing device 202 may also include an input device 220 for receiving input from user 201. Input device 220 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of media output component 215 and input device 220.

Client computing device 202 may also include a communication interface 225, which can be communicatively coupled to a remote device such as DMC computing device 102 (shown in FIG. 1). Communication interface 225 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in memory area 210 may be, for example, computer readable instructions for providing a user interface to user 201 via media output component 215 and, optionally, receiving and processing input from input device 220. A user interface may include, among other possibilities, a web browser and client application. Web browsers may enable users, such as user 201, to display and interact with media and other information typically embedded on a web page or a website. A client application may allow user 201 to interact with a server application from DMC computing device 102 (shown in FIG. 1), for example, to view and modify a model generated by DMC computing device 102.

Memory area 210 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer program.

Exemplary Server System

Figure 3:
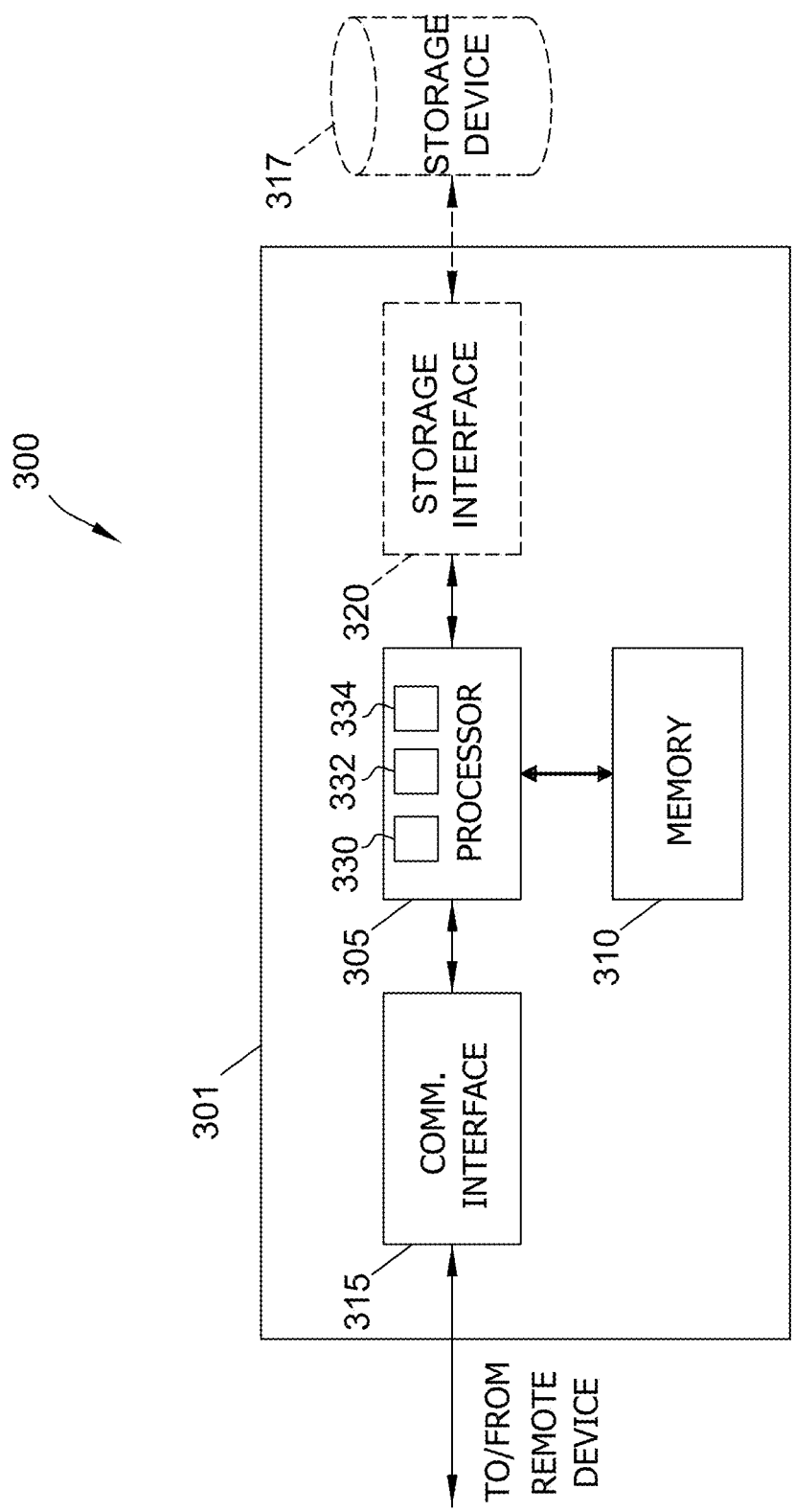
FIG. 3 illustrates an exemplary server system that may be used with the modeling system illustrated in FIG. 1.

FIG. 3 depicts an exemplary server system that may be used with the vehicle forensics system illustrated in FIG. 1. Server system 301 may be, for example, DMC computing device 102 (shown in FIG. 1).

In exemplary embodiments, server system 301 may include a processor 305 for executing instructions. Instructions may be stored in a memory area 310. Processor 305 may include one or more processing units (e.g., in a multi-core configuration) for executing instructions. The instructions may be executed within a variety of different operating systems on server system 301, such as UNIX, LINUX, Microsoft Windows®, etc. It should also be appreciated that upon initiation of a computer-based method, various instructions may be executed during initialization. Some operations may be required in order to perform one or more processes described herein, while other operations may be more general and/or specific to a particular programming language (e.g., C, C#, C++, Java, or other suitable programming languages, etc.).

In exemplary embodiments, processor 305 may include and/or be communicatively coupled to one or more modules for implementing the systems and methods described herein. Processor 305 may contain a location determining module 330 configured to determine a time and a location of a traffic collision. Processor 305 may also include a speech analysis module 332 configured to parse speech data corresponding to a statement given by a witness of the traffic collision and parse the speech data for phrases describing the traffic collision.

Processor 305 may also include a simulation module 334 configured to determine based upon the speech data, for each of a plurality of moments in time during the traffic collision, a position and an orientation of a vehicle along with the position and orientation of other property and/or persons involved in the traffic collision and generate a model and simulation thereof including a representation of the vehicle, property, and/or persons involved in the traffic collision, the simulation of the model based upon map data, contextual data, and the position and orientation of the vehicle along with the position and orientation of other property and/or persons involved in the traffic collision at each of the plurality of moments in time. Additionally or alternatively, simulation module 334 may be configured to determine, based upon vehicle telematics data, for each of a plurality of moments in time during the traffic collision, a position and an orientation of the vehicle along with the position and orientation of other property and/or persons.

Processor 305 may be operatively coupled to a communication interface 315 such that server system 301 is capable of communicating with map data computing device 120, contextual data computing device 122, speech data computing device 124, AV 126, user device 108, 110, 112, and/or telematics device 128 (all shown in FIG. 1), or another server system 301. For example, communication interface 315 may receive requests from user device 108, 110, 112 via the Internet.

Processor 305 may also be operatively coupled to a storage device 317, such as database 106 (shown in FIG. 1). Storage device 317 may be any computer-operated hardware suitable for storing and/or retrieving data. In some embodiments, storage device 317 may be integrated in server system 301. For example, server system 301 may include one or more hard disk drives as storage device 317.

In other embodiments, storage device 317 may be external to server system 301 and may be accessed by a plurality of server systems 301. For example, storage device 317 may include multiple storage units such as hard disks or solid state disks in a redundant array of inexpensive disks (RAID) configuration. Storage device 317 may include a storage area network (SAN) and/or a network attached storage (NAS) system.

In some embodiments, processor 305 may be operatively coupled to storage device 317 via a storage interface 320. Storage interface 320 may be any component capable of providing processor 305 with access to storage device 317. Storage interface 320 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 305 with access to storage device 317.

Memory area 310 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer program.

Exemplary Autonomous Vehicle

Figure 4:
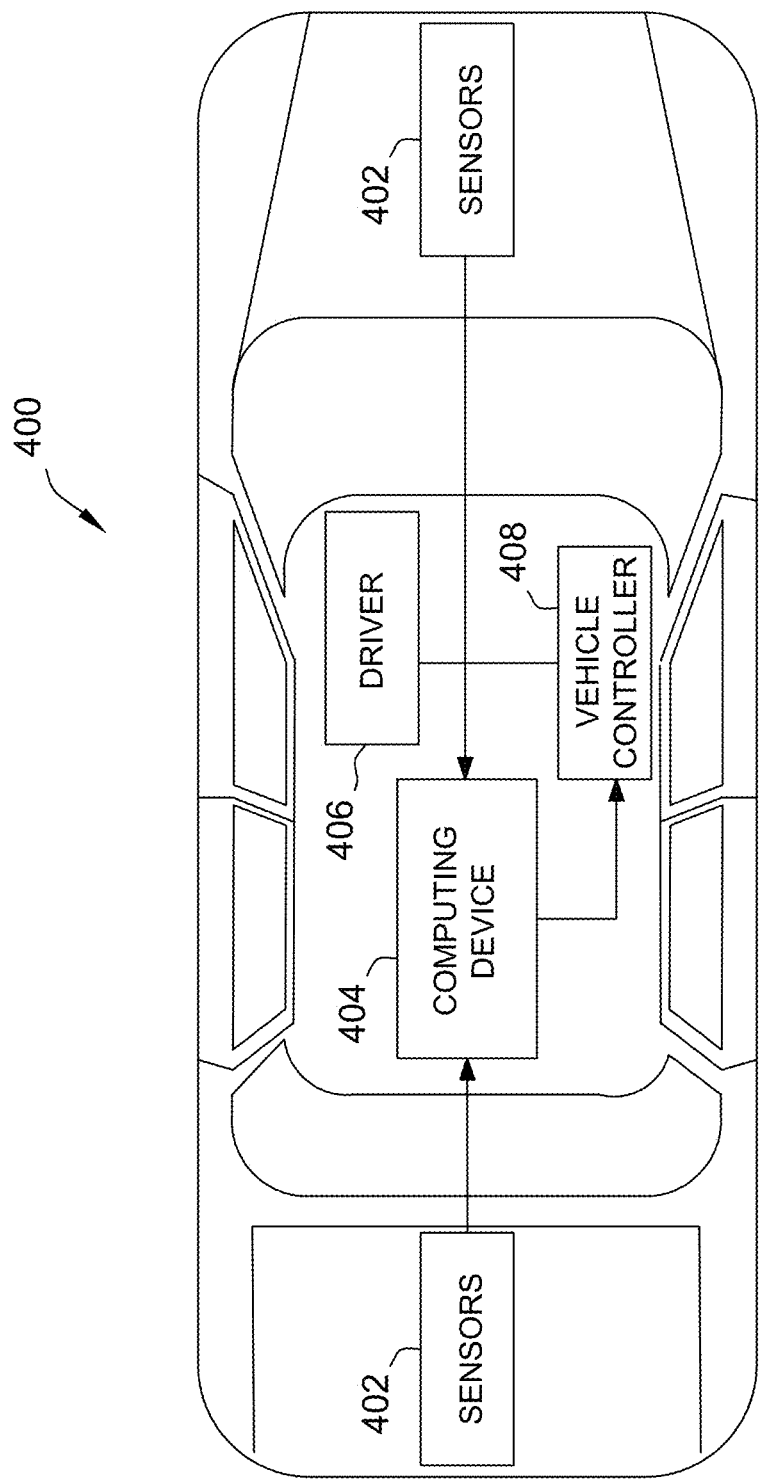
FIG. 4 illustrates a model of an exemplary vehicle that may be used with the modeling system illustrated in FIG. 1.

FIG. 4 depicts an exemplary autonomous vehicle (AV) 400. AV 400 may be, for example, AV 126 (shown in FIG. 1). AV 400 may be an autonomous or semi-autonomous vehicle capable of fulfilling the transportation capabilities of a traditional automobile or other vehicle. In these embodiments, AV 400 may be capable of sensing its environment and navigating without human input. In some exemplary embodiments, DMC computing device 102 (shown in FIG. 1) may be remote from AV 400 and receive data (e.g., telematics data) from AV 400. Alternatively, DMC computing device 102 may be implemented onboard AV 400, for example as computing device 404.

AV 400 may include a plurality of sensors 402, a computing device 404, and a vehicle controller 408. Sensors 402 may include, but are not limited to, temperature sensors, terrain sensors, weather sensors, accelerometers 116, gyroscopes 118, radar, LIDAR, Global Positioning System (GPS) 114, video devices, imaging devices, cameras (e.g., 2D and 3D cameras), audio recorders, and computer vision. Sensors 402 may be used to collect, for example, vehicle telematics data, as described above. Such telematics data may be transmitted by DMC computing device 102 (shown in FIG. 1).

Computing device 404 may be implemented, for example, as client computing device 202 (shown in FIG. 2). In exemplary embodiments, computing device 404 may receive data from sensors 402. In embodiments where DMC computing device 102 is remote from AV 400, computing device 404 may transmit data received from sensors 402 (e.g., vehicle telematics data) to DMC computing device 102. Alternatively, DMC computing device 102 may be implemented as computing device 404.

In exemplary embodiments, vehicle controller 408 may control operation of AV 400. For example, vehicle controller 408 may steer, accelerate, or decelerate AV 400 based upon data received, for example, from sensors 402. In some embodiments, vehicle controller 408 may include a display screen or touchscreen (not shown) that is capable of displaying information to and/or receiving input from driver 406.

In other embodiments, vehicle controller 408 may be capable of wirelessly communicating with a user device 108-112 (shown in FIG. 1) such as a mobile device (not shown) in AV 400. In these embodiments, vehicle controller 408 may be capable of communicating with the user of a mobile device, such as driver 406, through an application on the mobile device. In some embodiments, computing device 404 may include vehicle controller 408.

Exemplary Video and/or Photograph Analysis for Scene Modeling

Figure 5:
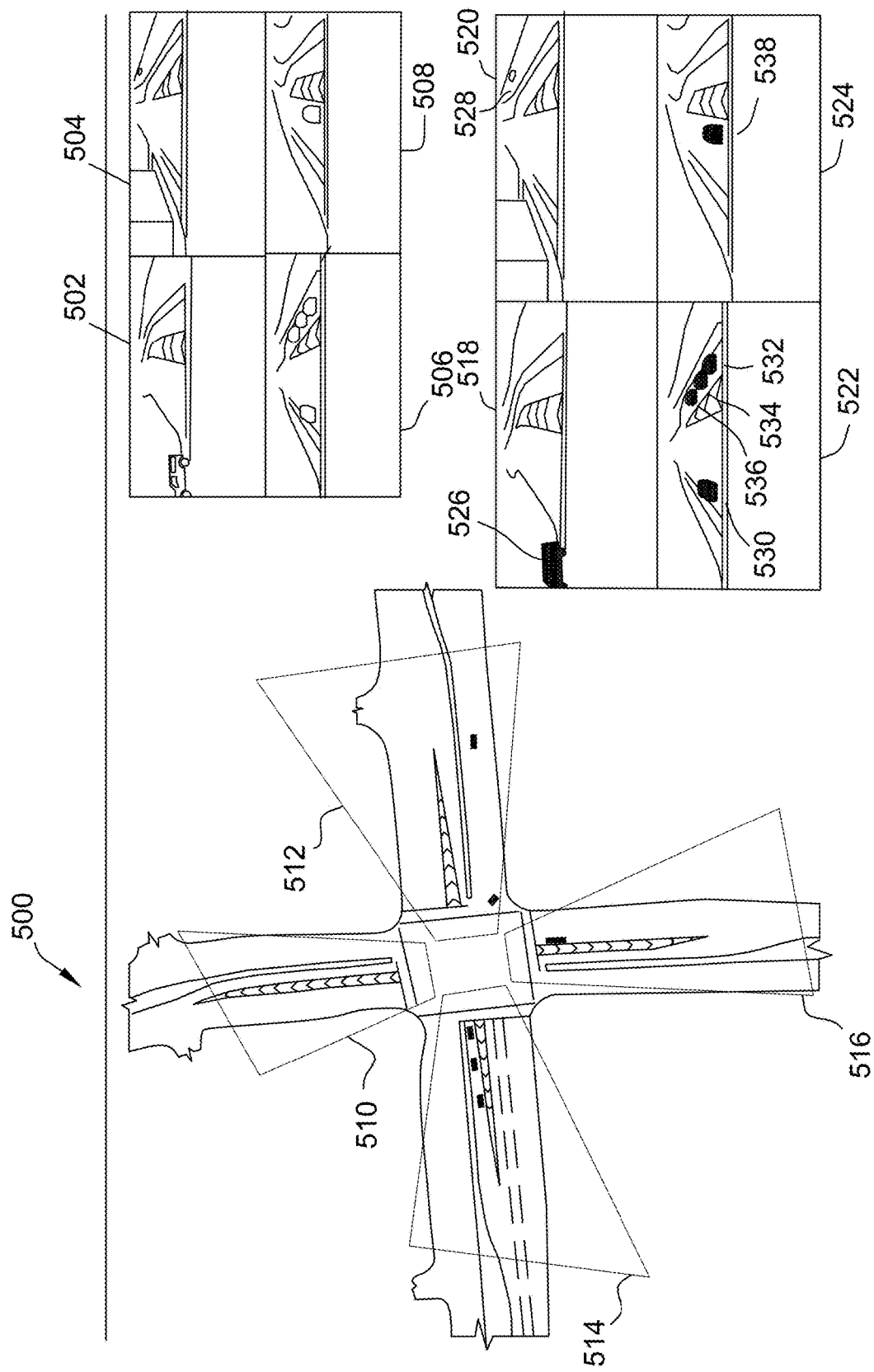
FIG. 5 illustrates an exemplary map and exemplary photographs/videos from which at least map data, photograph data, and/or telematics data may be generated by the modeling system illustrated in FIG. 1.

FIG. 5 illustrates an exemplary map 500 and exemplary viewpoints 502-508 from which photos and/or videos are retrieved. Map data, photograph data, and/or telematics data, as examples, may be generated by DMC computing device 102 based upon map 500 and/or viewpoints 502-508. For example, DMC computing device 102 may retrieve map 500 from database 106 upon determining a vehicular accident has occurred.

From map 500, DMC computing device 102 may be configured to gather map data (e.g., any data identifying geographic features associated with the scene of a collision). Examples of map data include, but are not limited to, the locations of vehicle thoroughfares (e.g., streets, roads, or highways), sidewalks, railroads, water features, structures (e.g., buildings, fences, guard rails, or walls), terrain and/or topographical features (e.g., hills), and/or objects (e.g., foliage, road signs, or utility poles). Map data may also include information regarding specific vehicle thoroughfares, for example, a number of lanes, a direction of travel of each lane, road-specific traffic regulations (e.g., speed limits, school zones, or weight limits), presence of regulatory signs and signals (e.g., lane markings, railroad crossing gates, stop signs, or traffic signals), road dimensions (e.g., width of the lanes), road features (e.g., the presence and type of medians or barriers, the material and condition of road surfaces, or the presence of bridges and tunnels), and/or road topography (e.g., inclines in the road).

DMC computing device 102 may also be configured to generate vehicle telematics data from map 500 and/or viewpoints 502-508. Telematics data gathered by DMC computing device 102 may include the position, yaw, speed, acceleration, deceleration, and other characteristics of a vehicle's motion and orientation.

Further, as shown in FIG. 5, DMC computing device 102 may also retrieve exemplary viewpoints 502-508 (e.g., photographs and/or videos from traffic signal cameras). In FIG. 5, viewpoint 502 corresponds to a photograph and/or video taken from a camera with range 510, viewpoint 504 corresponds to a photograph and/or video taken from a camera with range 512, viewpoint 506 corresponds to a photograph and/or video taken from a camera with range 514, viewpoint 508 corresponds to a photograph and/or video taken from a camera with range 516. DMC computing device 102 may analyze viewpoints 502-508, in some embodiments in combination with map 500, to generate map data and/or telematics data as described above.

In the exemplary embodiment, DMC computing device 102 may generate overlays 518-524 based upon an analysis of each viewpoints 502-508. In the example shown in FIG. 5, overlay 518 corresponds to viewpoint 502, overlay 520 corresponds to viewpoint 504, overlay 522 corresponds to viewpoint 506, and overlay 524 corresponds to viewpoint 508. As shown in overlay 518, DMC computing device 102 has analyzed viewpoint 502 and identified a vehicle 526. From viewpoint 504, DMC computing device 102 has identified a vehicle 528 and generated overlay 520. From viewpoint 506, DMC computing device 102 has identified vehicles 530-536 and generated overlay 522. From viewpoint 508, DMC computing device 102 has identified vehicle 538 and generated overlay 524. Upon identifying vehicles 526-538, DMC computing device 102 generates overlays 518-524 by, for example, overlaying a different color on each of vehicles 526-528. DMC computing device 102 may further be configured to overlay the colors on vehicles 526-538 on map 500.

In some embodiments, DMC computing device 102 may identify vehicles 526-538 in a matter other than overlaying colors on vehicles 526-538 (e.g., assigning each vehicle a number, etc.). Accordingly, by generating overlays 518-524, a user (e.g., an insurance representative) may more easily identify vehicles 526-538 when viewing an output from DMC computing device 102. In some embodiments, colors of the representations of vehicles (e.g., representations of vehicles 526-528) may match the colors applied by DMC computing device 102 to an overlay (e.g., overlays 518-524).

After identifying each of vehicles 526-538, DMC computing device 102 may be configured to generated telematics data regarding each of vehicles 526-538. For example, DMC computing device 102 may receive a live video feed and/or recorded video from at least one of map 500 and/or viewpoints 502-508. After identifying vehicles 526-538, DMC computing device 102 may track vehicles 526-538 on at least one of map 500 and/or viewpoints 502-508 to generate telematics data including a position, yaw, speed, acceleration, deceleration, and other characteristics of at least one of vehicle's 526-538 motion and orientation.

Accordingly, based at least on map data, photographic data, and/or telematics data generated by DMC computing device 102 based on analysis of photographs and/or videos received from at least one of map 500 and/or viewpoints 502-508, DMC computing device 102 may generate a dynamic scene model as described below with respect to FIG. 6.

Exemplary Dynamic Scene Model

Figure 6:
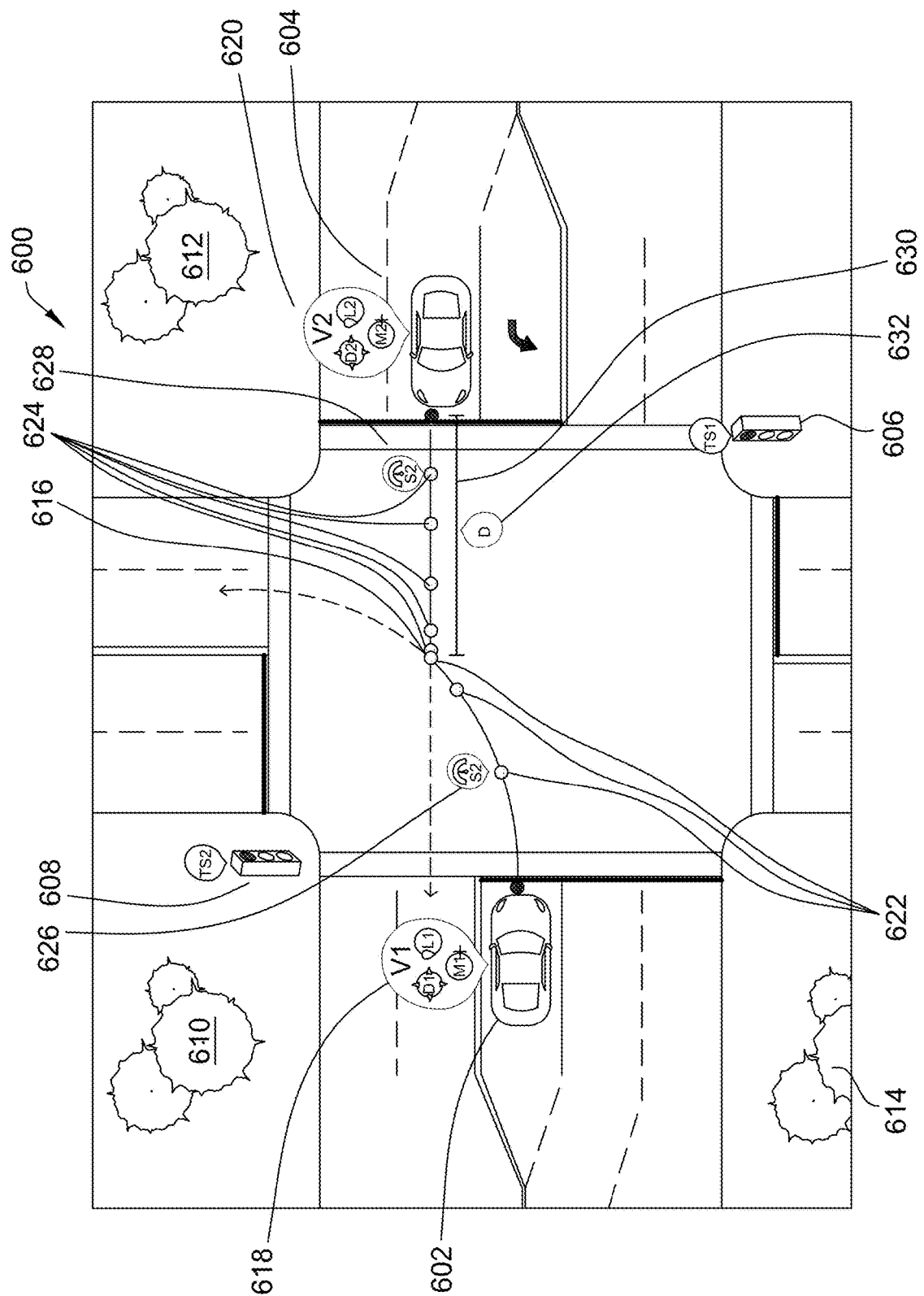
FIG. 6 illustrates an exemplary model generated by the modeling system shown in FIG. 1.

FIG. 6 illustrates an exemplary scene model 600 generated by DMC computing device 102. DMC computing device 102 may generate a model exemplifying a simulation depicting the scene of a collision. Scene model 600 may be based upon, for example, map data, telematics data, speech data, and/or other data (such as image, audio, and/or sensor data generated and received from the various reliable sources mentioned above) as described herein, and enables individuals not present at the scene of the collision (e.g., insurance claims employees) to visualize the scene. Further, scene model 600 is dynamically updateable (e.g., based upon inputs received from at least one of user computing devices 108-112) such that different parties involved in the claims process may have a scene model 600 generated by DMC computing device 102 that is specific to their account of how the accident occurred.

To generate scene model 600, DMC computing device 102 may, for example, compile map data into a format that enables the DMC computing device 102 to display a visual representation (e.g., model 600) of the scene of the collision. DMC computing device 102 may compile data representing the road itself (e.g., the width of the road, the number of lanes, the terrain, etc.). DMC computing device 102 may further compile data representing a vicinity of the collision (e.g., the locations of structures and objects near the location).

To generate scene model 600, DMC computing device 102 may compile contextual data into a format that enables DMC computing device 102 to display contextual conditions in scene model 600. For example, the visual representation may include a representation of weather, construction, or the presence of traffic at the scene of the collision. In embodiments where the positions of specific vehicles are available, the visual representation may include representations of the specific vehicles at their respective locations.

As shown in model 600, vehicles 602 and 604 are shown as facing each other in their respective lanes. Such a visual representation enables an individual remote from and/or unfamiliar with the scene of the collision to understand the context of the collision. For example, an insurance representative may familiarize himself or herself with the scene prior to hearing eyewitness accounts of the collision to better be able to interpret and/or verify the accuracy of the eyewitness accounts.

To model the collision, DMC computing device 102 may determine the position and orientation of one or more vehicles along with the position and orientation of other property and/or persons involved in the collision for a plurality of moments in time during the collision. DMC computing device 102 may model the collision based upon, for example, speech data and/or vehicle telematics data. DMC computing device 102 may further use additional data to model the collision (e.g., vehicle specification data, photographic data, text data, and/or physics data).

DMC computing device 102 may determine the position and orientation of the vehicle along with the position and orientation of other property and/or persons based upon the speech data. DMC computing device 102 may use speech data to determine the positions and orientations of the vehicles along with the position and orientation of other property and/or persons involved in the collision. For example, DMC computing device 102 may interpret phrases indicating the relative positions of vehicles to determine the behavior of the vehicles during the collision.

DMC computing device 102 may further interpret phrases indicating motion (e.g., direction of travel, speed, acceleration, etc.) and contact (e.g., parts of vehicles and/or objects that came into contact during the collision) to infer the positions and orientations of vehicles 602 and 604 during the collision. In certain embodiments, DMC computing device 102 may utilize machine learning techniques to develop a model for accurately simulating a collision based upon speech data.

Based upon the speech data, DMC computing device 102 may generate a visual representation (e.g., model 600) of vehicles involved in the accident based upon the determined positions and orientations of the vehicles 602 and 604 over the course of the collision. For example, the vehicles 602 and 604 may appear to move and come into contact in a manner as described in the speech data. To generate the model using speech data, DMC computing device 102 may disregard speech data that DMC computing device 102 determines to be conflicting. Thus, the model may conform as close as possible to an eyewitness statement while maintaining a physically accurate depiction of the collision.

Additionally or alternatively, DMC computing device 102 may determine the position and orientation of vehicle 602 and 604 along with the position and orientation of other property and/or persons based upon vehicle telematics data. Vehicle telematics data includes data retrieved from a sensor-equipped vehicle involved in the collision (e.g., AV 126) or a device onboard a vehicle involved in the collision (e.g., a mobile phone device or telematics 128 device installed by an insurance company). Vehicle telematics data may include data derived from, for example, an accelerometer, gyroscope, or GPS device, and indicate the position, yaw, speed, acceleration, deceleration, braking, cornering, and other characteristics of the vehicle's motion and orientation. Such vehicle telematics data may be used by DMC computing device 102 to determine the behavior of the vehicle from which it is derived during the collision.

To generate the model, DMC computing device 102 may generate a representation of the vehicle 602, 604 from which the vehicle telematics data was received that behaves in accordance with the telematics data (e.g., the simulated vehicle appears to move and change orientation in accordance with the telematics data). The model thus reflects the actual behavior of the vehicle in the collision and enables analysis of the collision even in cases where no eyewitnesses are available or present at the scene of the collision.

DMC computing device 102 may further determine the position and orientation of a vehicle 602, 604 along with the position and orientation of other property and/or persons based upon vehicle specification data. DMC computing device 102 may use vehicle specification data to accurately depict vehicles 602, 604 in the simulation and ensure that behavior of vehicles 602, 604 in the situation corresponds to a physically possible scenario. For example, DMC computing device 102 may simulate the collision such that simulated representation of a vehicle 602, 604 does not outperform the actual capabilities of the vehicle (e.g., by accelerating and decelerating as an actual vehicle with the same specifications could) and behaves realistically when coming into simulated contact with other representations of vehicles or objects (e.g., by appearing to move and deform as an actual vehicle having the same specifications would).

DMC computing device 102 may further determine the position and orientation of the vehicle along with the position and orientation of other property and/or persons based upon photographic data. For example, photographic data may include photographs taken of the scene of the collision and of damage to the vehicles. Photographs of the scene of the collision may include, for example, the final resting positions of the vehicles following the collision. Photographic data may further include video taken by cameras onboard the vehicle or cameras having a view of the scene of the collision (e.g. surveillance cameras).

DMC computing device 102 may generate the model so that the position and orientation of representations of vehicles 602, 604 corresponds to the positions of the vehicles in photographs and/or of the scene at the moment depicted by the photograph and/or video. Photographs of damage to vehicles 602, 604 may indicate points of contact (e.g., points of damage indicating contact between two vehicles or between vehicles and objects) during the collision. DMC computing device 102 may generate the model so that the points of contact in the simulated collision correspond to points of contact indicated by the photographs.

DMC computing device 102 may further determine the position and orientation of the vehicle along with the position and orientation of other property and/or persons based upon text data. For example, text data may include documents describing the collision (e.g., a police report). DMC computing device 102 may parse text data for terms and phrases indicative of the behavior of the vehicles in the collision. DMC computing device 102 may utilize the parsed text data to determine the positions and orientations of vehicles along with the position and orientation of other property and/or persons during the course of the collision.

DMC computing device 102 may further determine the position and orientation of the vehicle along with the position and orientation of other property and/or persons based upon physics data. DMC computing device 102 may apply physics data to other data, (e.g., map data, contextual data, and vehicle specification data) to determine physical constraints for the simulation corresponding to realistic physics of the collision.

For example, DMC computing device 102 may apply information regarding the coefficient of friction of the road surface and the mass of a vehicle to determine a maximum capability of the vehicle to decelerate. If, for example, speech data indicates that the vehicle decelerated at a faster rate than is physically possible, DMC computing device 102 may disregard the conflicting speech data when simulating the collision. The simulation thus may more accurately reflect the actual behavior of the vehicle in the collision.

Accordingly, based upon the gathered data described herein, DMC computing device 102 is configured to generate model 600 to simulate a collision. Model 600 includes visual representations of different objects determined to be at the scene of the collision by DMC computing device 102 based upon the gathered data. For example, in addition to visual representations of vehicles 602, 604, DMC computing device 102 has also determined that traffic lights 606, 608 and objects 610-614 (e.g., trees) were present at the scene of the collision shown in model 600.

In the exemplary embodiment, DMC computing device 102 may be configured generate model 600 based upon all gathered data. Model 600 may be a first model before any user inputs are received by DMC computing device 102 (e.g., modifications made to model 600 by a driver and/or insurance representative). After model 600 is generated by DMC computing device 102, model 600 may be transmitted to at least one of a user device 108 associated with a first driver, a user device 110 associated with a second driver, and a user device 112 associated with an insurance representative. Accordingly, upon receipt of model 600, the first driver (or passenger), second driver, and insurance representative may each make modifications to model 600 such that a new model, specific to their inputs, is generated by DMC computing device 102 for each of the first driver, second driver, and insurance representative (e.g., as examples, model 600 may be transmitted to any number of devices for modification by any number of users).

In the exemplary embodiment, DMC computing device 102 is configured to, in response to inputs received from user computing device based upon user inputs, dynamically update model 600. For example, a user computing device may display model 600 at a graphical user interface (GUI) of a user computing device (e.g., devices 108-112). Accordingly the GUI may receive inputs and transmit signals based upon the inputs to DMC computing device 102. DMC computing device 102 may be configured to dynamically update model 600 (e.g., saving the updated model in database 106) and transmit an updated model back to the user computing device. Accordingly, a user can modify model 600 and/or an updated model in real time by DMC computing device 102 receiving inputs from and dynamically updating a GUI of a user computing device to display an updated model.

In some embodiments, DMC computing device 102 may be configured to accept all input data received from at least one user for the purposes of generating at least one updated model. For example, as described herein, a driver of vehicle 602 and a driver of vehicle 604 may each have their own account of how an accident occurred.

Accordingly, when each of the drivers inputs modifications to model 600 (e.g., at a GUI as described above), DMC computing device 102 may be configured to accept each modification inputted and save each modified model in database 106. For example, even if DMC computing device 102 has computed from gathered data that vehicle 602 was moving at a first speed, the driver of vehicle 602 may input that instead vehicle 602 was moving at a second speed. DMC computing device 102 may accept the second speed as being the speed for vehicle 602 in the updated model, despite the second speed being different from the determined first speed, such that the driver is satisfied with the updated model being modified based upon their account of how the accident occurred.

In some embodiments, each parameter of model 600 may be modifiable by a user. Accordingly, each user may have a modified model associated with their account of how the accident occurred stored in database 106, along with model 600 generated by DMC computing device 102 based upon gathered data before any user inputs were applied and/or including at least some user inputs based upon data not previously gathered. Thus, as the claims process advances, each party involved has access to a model demonstrating their account of how the accident occurred, along with the model generated based upon gathered data.

As explained above, inputs may be made by a user at a user device 108-112 to modify a model received from DMC computing device 102. A user may modify any aspect of model 600 as it is received. Inputs received by user device 108-112 from a user, and transmitted to DMC computing device 102, may be received from, as examples, a user operating a keyboard, a pointing device, a mouse, a stylus, a touch sensitive panel (e.g., a touch pad or a touch screen including a GUI) of a user device 108-112. As examples a user may modify the location of at least one of objects 610-614 as shown in model 600 by pressing a GUI of a user device 108-112 and dragging the at least one of objects 610-614 to a different location. Continuing the previous example, a user may add and/or delete an object 610-614.

Figure 7:
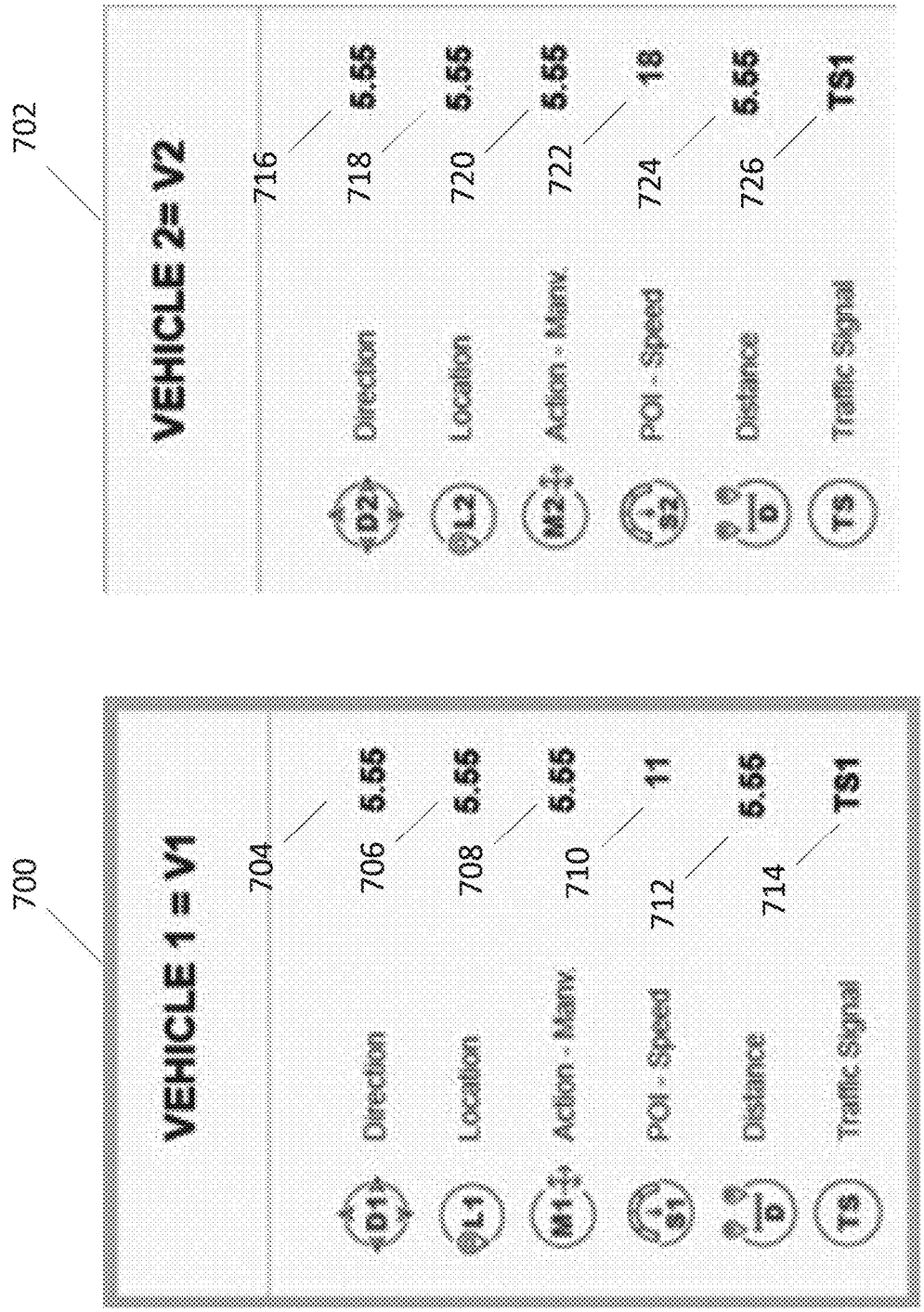
FIG. 7 illustrates exemplary data tables generated by the modeling system shown in FIG. 1.

In addition to moving, adding, and/or removing objects and/or details of model 600 (e.g., a number of lanes of traffic, a number of vehicles, etc.), a user may also modify telematics data of model 600. For example, when a simulation of model 600 is executed by DMC computing device 102, for each of vehicles 602, 604, DMC computing device 102 determines, as examples, a direction, location, action, speed, distance to collision, and traffic signal status (e.g., as shown in FIG. 7).

Accordingly, a user may modify any of the parameters associated with model 600 by entering new values in data tables (e.g., shown in FIG. 7) that, in some embodiments, are displayed along with model 600 at a user device 108-112. Also, upon receipt of modifications to at least one parameter of model 600 at a user device 108-112, the modification is transmitted to DMC computing device 102. DMC computing device 102 then modifies the model according to the received modification, and transmits a modified model to the respective user device 108-112.

In some embodiments, at least a portion 618 of data table 700 and/or a portion 620 of data table 702 may be displayed within model 600 itself. In some embodiments, DMC computing device 102 may indicate moments in time 622 at which data was collected for vehicle 602 and moments in time 624 at which data was collected for vehicle 602.

Further, points in time and/or other data corresponding to values in data table 700 may be displayed in model 600. For example, as shown in model 600, a first speed icon 626 corresponding to a point in time 624 at which vehicle 602 was travelling at speed 710, and a second speed icon 628 corresponding to a point in time 624 at which vehicle 604 was travelling at speed 722, may be displayed. Any data described herein may also be displayed in a visual format in model 600. As another example, a distance 712 to collision point 616 is represented by measurement 630 and icon 632.

Exemplary Dynamic Scene Model Data Tables

FIG. 7 illustrates exemplary data tables 700, 702 generated by DMC computing device 102. As explained above, DMC computing device 102 may generate model 600 based upon a variety of gathered data. At least a portion of the gathered data is shown in data tables 700, 702.

For example, data table 700 indicates, regarding vehicle 602, a direction 704, a location 706, an action 708, a speed 710, a distance 712 to collision point 616, and a traffic signal indicator 714 (e.g., indicating a status (e.g., green, yellow, red) of a traffic signal for vehicle 602). Further, data table 702 indicates, regarding vehicle 604, a direction 716, a location 718, an action 720, a speed 722, a distance 724 to collision point 616, and a traffic signal indicator 726.

In addition to modifying objects in model 600, a user may also modify model 600 based upon inputs received at DMC computing device 102, via a user device 108-112, modifying one or more values in at least one data table 700, 702. For example, a user may modify a speed 710 of vehicle 602 and traffic signal indicator 714 based upon their account of how the accident occurred. Accordingly, upon receipt of modifications to at least one data table 700, 702, DMC computing device 102 modifies model 600 in order to generate a new model specific to the user entering the modifications. In some embodiments, at least a portion from data table 700 and/or data table 702 may be displayed within model 600 itself.

Accordingly, DMC computing device 102 generates a model 600 based upon gathered data, and may generate at least one modified model based upon user inputs received (e.g., modifications to objects in model 600 and/or data tables 700, 702). Thus, DMC computing device 102 provides the ability to generate highly accurate models simulating accidents based upon gathered data, along with allowing different parties/users to modify model 600 such that the modified model exemplifies their specific account of how the accident occurred.

Exemplary Method for Generating a Dynamic Scene Model

Figure 8:
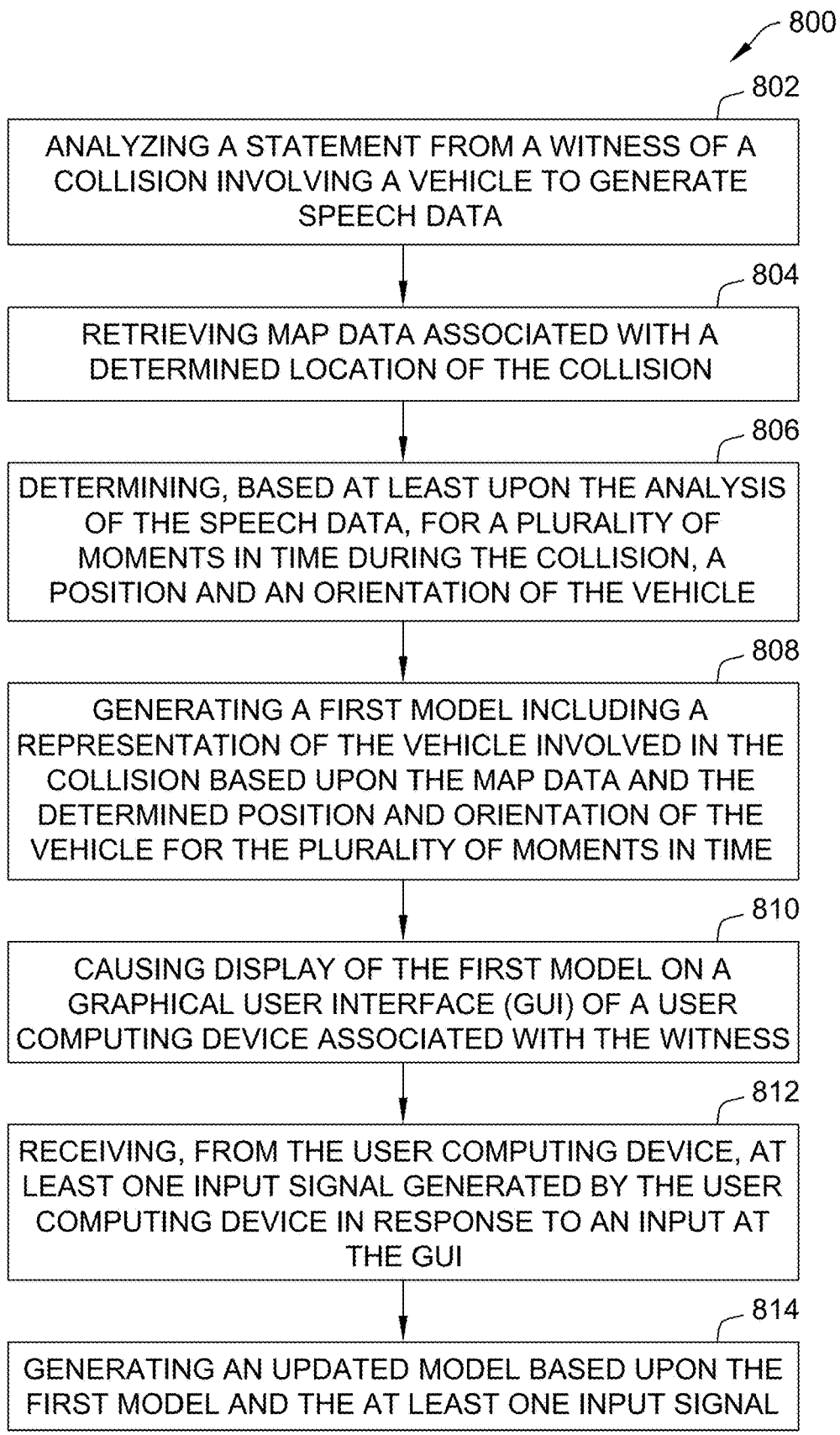
FIG. 8 illustrates an exemplary computer-implemented method implemented by the modeling system illustrated in FIG. 1.

FIG. 8 illustrates an exemplary computer-implemented method 800 for generating a dynamic scene model as described herein. Method 800 may be implemented by DMC computing device 102, and/or by one or more local or remote processors, servers, transceivers, and/or sensors. Method 800 may include analyzing 802 a statement from a witness of a collision involving a vehicle to generate speech data, retrieving 804 map data associated with a determined location of the collision, and determining 806, based at least upon the analysis of the speech data, for a plurality of moments in time during the collision, a position and an orientation of the vehicle.

Method 800 may further include generating 808 a first model (e.g., model 600) including a representation of the vehicle (e.g., vehicle 602) involved in the collision based upon the map data and the determined position and orientation of the vehicle for the plurality of moments in time and causing display 810 of the first model on a graphical user interface (GUI) of a user computing device (e.g., device 200) associated with the witness.

Method 800 may yet further include receiving 812, from the user computing device, at least one input signal generated by the user computing device in response to an input at the GUI, and/or generating 814 an updated model based upon the first model and the at least one input signal. The method may include additional, less, or alternate actions, including those discussed elsewhere herein.

Exemplary Method for Controlling a Gui to Implement A Dynamic Scene Model

Figure 9:
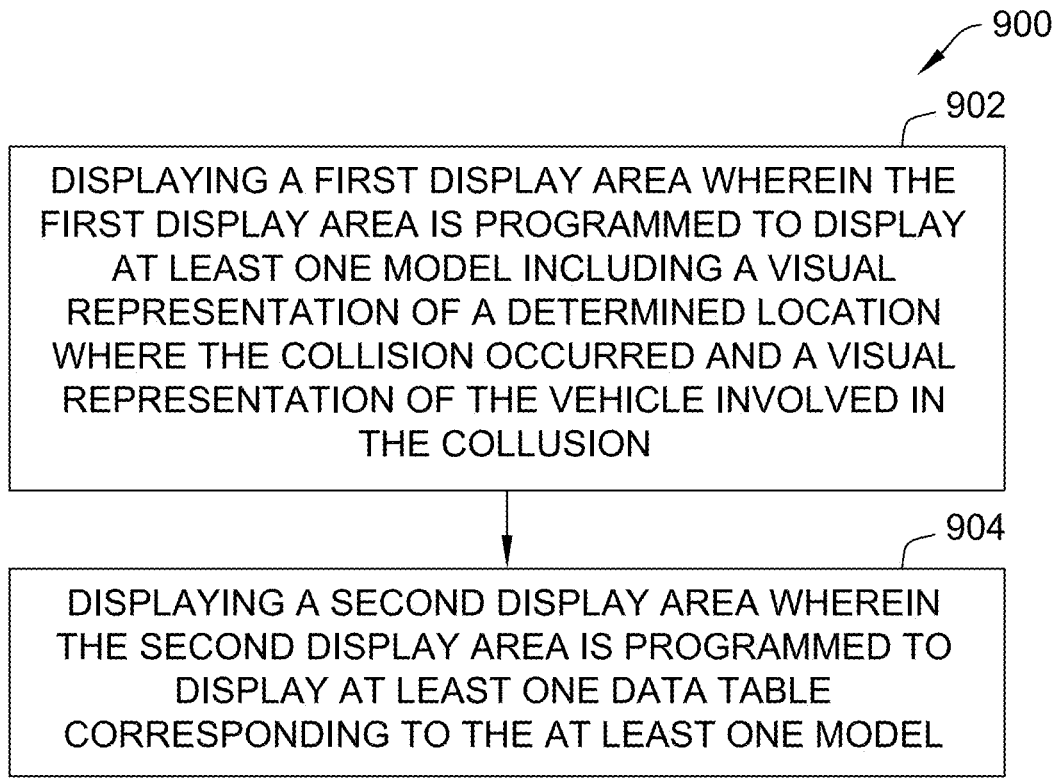
FIG. 9 illustrates another exemplary computer-implemented method implemented by the modeling system illustrated in FIG. 1.

FIG. 9 illustrates an exemplary computer-implemented method 900 for controlling a graphical user interface (GUI) (e.g., of client computing device 202) for a modeling system (e.g., DMC system 100). Method 900 may include displaying 902 a first display area, wherein the first display area is programmed to display the at least one model (e.g., model 600) including a visual representation of a determined location where the collision occurred, the visual representation of the determined location based in part on map data retrieved from the database and a visual representation of the vehicle involved in the collision.

Method 900 may further include displaying 904 a second display area wherein the second display area is programmed to display at least one data table (e.g., data tables 700, 702) corresponding to the at least one model, the at least one data table including telematics data regarding the vehicle involved in the collision, wherein movement of the visual representation of the vehicle on the GUI during a simulation of the at least one model is controlled at least by the telematics data and wherein the GUI is configured to receive user inputs such that the visual representations in the first display area and the at least one data table in the second display area are dynamically modifiable by a user. The method may include additional, less, or alternate actions, including those discussed elsewhere herein.

Machine Learning and Other Matters

The computer-implemented methods discussed herein may include additional, less, or alternate actions, including those discussed elsewhere herein. The methods may be implemented via one or more local or remote processors, transceivers, servers, and/or sensors (such as processors, transceivers, servers, and/or sensors mounted on vehicles or mobile devices, or associated with smart infrastructure or remote servers), and/or via computer-executable instructions stored on non-transitory computer-readable media or medium.

Additionally, the computer systems discussed herein may include additional, less, or alternate functionality, including that discussed elsewhere herein. The computer systems discussed herein may include or be implemented via computer-executable instructions stored on non-transitory computer-readable media or medium.

A processor or a processing element may be trained using supervised or unsupervised machine learning, and the machine learning program may employ a neural network, which may be a convolutional neural network, a deep learning neural network, or a combined learning module or program that learns in two or more fields or areas of interest. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as images, object statistics and information, and/or historical data. The machine learning programs may utilize deep learning algorithms that may be primarily focused on pattern recognition, and may be trained after processing multiple examples. The machine learning programs may include Bayesian program learning (BPL), voice recognition and synthesis, image or object recognition, optical character recognition, and/or natural language processing —either individually or in combination. The machine learning programs may also include natural language processing, semantic analysis, automatic reasoning, and/or other types of machine learning or artificial intelligence.

In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. In unsupervised machine learning, the processing element may be required to find its own structure in unlabeled example inputs.

As described above, the systems and methods described herein may use machine learning, for example, for pattern recognition. That is, machine learning algorithms may be used by DMC computing device 102 to attempt to identify patterns within speech data and between speech data, map data, contextual data, and/or vehicle telematics data, as examples. Further, machine learning algorithms may be used by DMC computing device 102 to generate a scene model for a simulation based upon map data and contextual data and/or generate the simulation based upon speech data and/or vehicle telematics data. Accordingly, the systems and methods described herein may use machine learning algorithms for both pattern recognition and predictive modeling (e.g., based upon data regarding previous accidents at particular locations/intersections).

In some aspects, the present embodiments may focus on using current and future technology to automate and enhance the claims process, specifically the initial loss report and claim investigation. The system may assist in automating the initial claim loss process by using geolocation from the initial loss report to automate an aerial map of the scene of the accident and provide time specific contextual data. The present embodiments may also use a natural language processor to dictate live calls using speech to text capabilities, automatically transcribing driver and witness verbal statements in real time for the claim file. The present embodiments may then render the statements and details of the accident into a modeled simulation, which would reconstruct the path of the vehicles as described by the drivers, witnesses, and points of contact. Lastly, using AI, the present embodiments may use at least vehicle data, scene photos, and vehicle damage photos to validate the crash reconstruction and statements of loss to assess liability.

The current claims process is highly manual and costly, where the majority of the liability is open to human error by the claims employees or parties of the loss. Currently, if a claims employee wants to find a map of the location they have to use the internet and are unable to validate how accurate or dated those maps are. Also, claims employees interpret and paraphrase driver statements for the claims file, but if they have been recorded then they have to be sent for transcription, incurring additional costs. Currently, claims employees use toy cars to reconstruct accidents and points of contact. The present embodiments may leverage current and developing technology to eliminate and/or limit human involvement and use data and AI to provide the claims employees with enhanced tools to complete their investigation.

In one aspect, the system may provide updates to maps, data, and photos from validated data sources. The system may provide an unbiased output for recording statements and recreating those recollections. Additionally, the system may reconstruct crashes using real world engineering and physics parameters (car weight, speed).

In one aspect, the present embodiments may provide a contextualized map of the scene of an accident. When the claim is filed, the platform will use existing maps (Map or Mapping API) and digital assets/models (urban layouts, buildings, vehicles) to recreate aerial and street level 2D and 3D maps of the scene of the accident in the model component using geolocation (the address, location, or GPS coordinates) of the loss. The model is configured to allow claims associates to review the scene and familiarize themselves with the location prior to contacting any drivers or witnesses.

The present embodiments may also provide time-specific contextual data (local condition information). When the claim is filed, the platform will use date and time stamps provided by the drivers, police reports, and/or vehicle data to provide contextual data at the time of the accident. The contextual data output may be pulled automatically, and provide the claims employee with the weather, visibility, road conditions, traffic, construction, and daylight/night time conditions from API sources.

The present embodiments may also provide speech to text functionality, including a dictated statement of loss. As the claims associate speaks with drivers and witnesses and takes their statements over the phone, the system may use a natural language processor to dictate the statement using speech to text, which will be used for the claim file notes/log, investigation, determination of liability/fault, subrogation, and litigation.

The present embodiments may also provide a collision physics simulator. The system would upload in real time the details of the accident into the model to recreate a video of the path of the vehicles and point of contact. Based upon the vehicle details in the file, the system may be configured to use real world and validated vehicle physical and engineering specifications related to gross weight, acceleration, deceleration, crump zones, etc. Using AI deep learning and data acquisition, the system may use data (semantic segmentation, depth map), scene photos (taken by the driver, vehicle, or vendor), and vehicle damage photos (estimatics) to validate statements by those involved or witnesses.

Exemplary Embodiments

In general, the present embodiments focus on using current and future technology to automate and enhance the claims process, specifically the initial loss report and claims investigation. The present embodiments may assist in creating a scene diagram visual using initial claim loss information from a combination of vehicle, aerial, and geolocation specific contextual data, and/or sensor, audio, or image data from other reliable sources as mentioned elsewhere herein. The present embodiments may also use this data to create a dynamically visual scene diagram to be used for claims investigations or evidence in a claim file. The present embodiments may create a diagram of the crash event creating a visual for taking into consideration the collected data and statements/details of the accident as described drivers, witnesses, and parties of contact. The report can be used by police departments, insurance companies, lawyers, and kind as a dynamic piece of evidence. The present embodiments may also use vehicle data, scene photos, and vehicle damage photos to recreate a scene diagram to assess liability.

The dynamic scene diagram may provide timely and accurate data including from statements of loss, maps, sensors, and photos into a visual. The diagram may provide an unbiased visual representation for all evidence collected after a loss.

The present embodiments may provide visual interaction, and be especially useful for the customer and claims associate during claim filing to explain what happened during the incident with visuals—a collaborative tool for scene diagrams. The present embodiments may provide a dynamic scene diagram and may collect details of the accident into one visual to recreate a dynamic scene of loss evidence collected. The diagram may take into consideration OEM or aftermarket hardware/software and traffic signal data. This data may reflect any videos of the loss and vehicle/driver behaviors to include direction of travel, speed, maneuver, point of impact, and distance.

The present embodiments may also provide a contextualized map of the scene of an accident. The diagram may use date and time stamps provided by the drivers, police reports, and/or vehicle data to provide contextual data at the time of the accident. The contextual data output may pull automatically and provide the claims employee with the weather, visibility, road conditions, traffic, construction, and daylight/night time conditions from API sources.

The present embodiments may further provide speech-to-text functionality, and a dictated statement of loss. As the claims associate speaks with the drivers and witnesses and takes their statements over the phone, the diagram will use a Natural Language Processor to dictate the statement using speech to text, which will be used for the claim file notes/log, investigation, determination of liability/fault, subrogation, and/or generation or modification of a virtual collision reconstruction.

More specifically, in one embodiment, a dynamic model creation ("DMC") computing device including a processor in communication with a memory device may be provided. The processor may be configured to: (i) analyze a statement from a witness of a collision involving a vehicle to generate speech data; (ii) retrieve map data associated with a determined location of the collision; (iii) determine, based at least upon the analysis of the speech data, for a plurality of moments in time during the collision, a position and an orientation of the vehicle; (iv) generate a first model including a representation of the vehicle involved in the collision based upon the map data and the determined position and orientation of the vehicle for the plurality of moments in time (or alternatively, modify or adjust a first model, that includes a representation of the vehicle involved in the collision that is generated based upon data from other reliable sources, using the map data and the determined position and orientation of the vehicle for the plurality of moments in time); (v) cause display of the first model on a graphical user interface (GUI) of a user computing device associated with the witness; (vi) receive, from the user computing device, at least one input signal generated by the user computing device in response to an input at the GUI; and/or (vii) generate an updated model based upon the first model and the at least one input signal. The DMC computing device may include additional, less, or alternate actions, including those discussed elsewhere herein.

In some embodiments, the DMC computing device (and/or one or more local or remote processors, servers, transceivers, and/or sensors) may be further configured to: (i) determine, based upon the speech data, for a second plurality of moments in time during the collision, a position and an orientation of a second vehicle involved in the collision; and/or (ii) generate the first model including a representation of the vehicle and the second vehicle.

In some embodiments, the DMC computing device (and/or one or more local or remote processors, servers, transceivers, and/or sensors) may be further configured to (i) receive contextual data including vehicle telematics data; and/or (ii) generate the first model based at least in part upon the vehicle telematics data. In some embodiments, the DMC computing device may be further configured to retrieve at least a portion of the contextual data from an autonomous vehicle including at least one sensor wherein the portion of the contextual data retrieved from the autonomous vehicle includes data captured by the at least one sensor.

In some embodiments, the DMC computing device (and/or one or more local or remote processors, servers, transceivers, and/or sensors) may be further configured to: (i) analyze the first model and the updated model by comparing the first model to the updated model; (ii) determine, based upon the analysis of the first model and the updated model, at least one discrepancy between the first model and the updated model; (iii) retrieve verified data from the memory device, wherein the verified data includes vehicle telematics data verified by the DMC computing device as being generated by at least one of an accelerometer, a gyroscope, and a global positioning system (GPS) device; and/or (iv) determine, based upon the at least one discrepancy and the verified data, that one of the first model and the updated model represents a more accurate model of the collision. In some embodiments, the DMC computing device may further be configured to determine that one of the first model and the updated model represents the more accurate model of the collision based at least in part upon which of the first model and the updated model better corresponds to the verified data.

In some embodiments, the DMC computing device (and/or one or more local or remote processors, servers, transceivers, and/or sensors) may be further configured to: (i) retrieve historical data from the memory device, the historical data including data regarding previous collisions at the determined location of the collision; and/or (ii) determine that one of the first model and the updated model represents the more accurate model of the collision based at least in part upon which of the first model and the updated model better corresponds to the historical data.

In another embodiment, a computer-implemented method implemented by a dynamic model creation (DMC) computing device including a processor in communication with a memory device may be provided. The computer-implemented method may include, via the DMC computing device (and/or one or more local or remote processors, servers, transceivers, and/or sensors): (i) analyzing a statement from a witness of a collision involving a vehicle to generate speech data; (ii) retrieving map data associated with a determined location of the collision; (iii) determining, based at least upon the analysis of the speech data, for a plurality of moments in time during the collision, a position and an orientation of the vehicle; (iv) generating a first model including a representation of the vehicle involved in the collision based upon the map data and the determined position and orientation of the vehicle for the plurality of moments in time (or alternatively, modify or adjust a first model, that includes a representation of the vehicle involved in the collision that is generated based upon data from other reliable sources, using the map data and the determined position and orientation of the vehicle for the plurality of moments in time); (v) causing display of the first model on a graphical user interface (GUI) of a user computing device associated with the witness; (vi) receiving, from the user computing device, at least one input signal generated by the user computing device in response to an input at the GUI; and/or (vii) generating an updated model based upon the first model and the at least one input signal. The computer-implemented method may include additional, less, or alternate actions, including those discussed elsewhere herein.

In some embodiments, the computer-implemented method may further include, via one or more local or remote processors, servers, transceivers, and/or sensors: (i) determining, based upon the speech data, for a second plurality of moments in time during the collision, a position and an orientation of a second vehicle involved in the collision; and/or (ii) generating (or modifying/adjusting) the first model including a representation of the vehicle and the second vehicle. In some embodiments, the computer-implemented method may further include, via one or more local or remote processors, servers, transceivers, and/or sensors: (i) receiving contextual data including vehicle telematics data; and/or (ii) generating the first model based at least in part upon the vehicle telematics data. In some embodiments, the computer-implemented method may further include, via one or more local or remote processors, servers, transceivers, and/or sensors, retrieving at least a portion of the contextual data from an autonomous vehicle including at least one sensor wherein the portion of the contextual data retrieved from the autonomous vehicle includes data captured by the at least one sensor.

In some embodiments, the computer-implemented method may further include, via one or more local or remote processors, servers, transceivers, and/or sensors: (i) analyzing the first model and the updated model by comparing the first model to the updated model; (ii) determining, based upon the analysis of the first model and the updated model, at least one discrepancy between the first model and the updated model; (iii) retrieving verified data from the memory device, wherein the verified data includes vehicle telematics data verified by the DMC computing device as being generated by at least one of an accelerometer, a gyroscope, and a global positioning system (GPS) device; and/or (iv) determining, based upon the at least one discrepancy and the verified data, that one of the first model and the updated model represents a more accurate model of the collision.

In some embodiments, the computer-implemented method may include, via one or more local or remote processors, servers, transceivers, and/or sensors, determining that one of the first model and the updated model represents the more accurate model of the collision based at least in part upon which of the first model and the updated model better corresponds to the verified data. In some embodiments the computer-implemented method may further include, via one or more local or remote processors, servers, transceivers, and/or sensors: (i) retrieving historical data from the memory device, the historical data including data regarding previous collisions at the determined location of the collision; and/or (ii) determining that one of the first model and the updated model represents the more accurate model of the collision based at least in part upon which of the first model and the updated model better corresponds to the historical data.

In yet another embodiment, a non-transitory computer-readable media having computer-executable instructions embodied thereon may be provided. The computer-executable instructions, when executed by a dynamic model creation ("DMC") computing device including a processor in communication with a memory device, may cause the processor (and/or one or more local or remote processors, servers, transceivers, and/or sensors) to: (i) analyze a statement from a witness of a collision involving a vehicle to generate speech data; (ii) retrieve map data associated with a determined location of the collision; (iii) determine, based at least upon the analysis of the speech data, for a plurality of moments in time during the collision, a position and an orientation of the vehicle; (iv) generate (or modify/adjust) a first model including a representation of the vehicle involved in the collision based upon the map data and the determined position and orientation of the vehicle for the plurality of moments in time; (v) cause display of the first model on a graphical user interface (GUI) of a user computing device associated with the witness; (vi) receive, from the user computing device, at least one input signal generated by the user computing device in response to an input at the GUI; and/or (viii) generate an updated model based upon the first model and the at least one input signal. The computer-readable storage media may include additional, less, or alternate actions, including those discussed elsewhere herein.

In some embodiments, the instructions may further cause the processor (and/or one or more local or remote processors, servers, transceivers, and/or sensors) to: (i) determine, based upon the speech data, for a second plurality of moments in time during the collision, a position and an orientation of a second vehicle involved in the collision; and/or (ii) generate the first model including a representation of the vehicle and the second vehicle. In some embodiments, the instructions may further cause the processor (and/or one or more local or remote processors, servers, transceivers, and/or sensors) to: (i) receive contextual data including vehicle telematics data; and/or (ii) generate the first model based at least in part upon the vehicle telematics data.

In some embodiments, the instructions may further cause the processor (and/or one or more local or remote processors, servers, transceivers, and/or sensors) to: (i) analyze the first model and the updated model by comparing the first model to the updated model; (ii) determine, based upon the analysis of the first model and the updated model, at least one discrepancy between the first model and the updated model; (iii) retrieve verified data from the memory device, wherein the verified data includes vehicle telematics data verified by the DMC computing device as being generated by at least one of an accelerometer, a gyroscope, and a global positioning system (GPS) device; and/or (iv) determine, based upon the at least one discrepancy and the verified data, that one of the first model and the updated model represents a more accurate model of the collision.

In some embodiments, the instructions may further cause the processor (and/or one or more local or remote processors, servers, transceivers, and/or sensors) to determine that one of the first model and the updated model represents the more accurate model of the collision based at least in part upon which of the first model and the updated model better corresponds to the verified data. In some embodiments, the instructions may further cause the processor (and/or one or more local or remote processors, servers, transceivers, and/or sensors) to: (i) retrieve historical data from the memory device, the historical data including data regarding previous collisions at the determined location of the collision; and/or (ii) determine that one of the first model and the updated model represents the more accurate model of the collision based at least in part upon which of the first model and the updated model better corresponds to the historical data.

In one embodiment, a graphical user interface (GUI) for a dynamic model creation (DMC) system may be provided. The DMC system may include a DMC computing device in communication with a database, the database storing at least one model generated by the DMC computing device for representing a vehicle involved in a collision based upon collected data. The GUI may include: (i) a first display area programmed to display the at least one model including a visual representation of a determined location where the collision occurred, the visual representation of the determined location based in part on map data retrieved from the database and a visual representation of the vehicle involved in the collision; and/or (ii) a second display area programmed to display at least one data table corresponding to the at least one model, the at least one data table including telematics data regarding the vehicle involved in the collision, wherein movement of the visual representation of the vehicle on the GUI during a simulation of the at least one model is controlled at least by the telematics data, and wherein the GUI is configured to receive user inputs such that the visual representations in the first display area and the at least one data table in the second display area are dynamically modifiable by a user. The GUI may include additional, less, or alternate actions, including those discussed elsewhere herein.

In some embodiments of the GUI, the first display area may be further programmed to display a visual representation of a second vehicle involved in the collision and the second display area is further programmed to display the at least one data table including telematics data regarding the second vehicle involved in the collision. In some embodiments of the GUI, the first display area may be further programmed to display: (i) the visual representation of the vehicle at a first plurality of moments in time during the collision; and/or (ii) the visual representation of the second vehicle at a second plurality of moments in time during the collision. In some embodiments of the GUI, the first display area may be further programmed to display the visual representation of the determined location, wherein the visual representation of the determined location includes a visual representation of at least one of i) a regulatory signal, ii) a regulatory sign, iii) a road feature, and/or iv) a road topography.

In some embodiments of the GUI, the first display area may be further programmed to: (i) generate an input signal based upon a user input at the first display area of the GUI, the input signal corresponding to at least one modification of at least one visual representation in the first display area; (ii) transmit the input signal to the DMC computing device; (iii) receive an updated model from the DMC computing device, the updated model incorporating the at least one modification of the at least one visual representation; and/or (iv) display the updated model.

In some embodiments of the GUI, the second display area may be further programmed to (i) generate an input signal based upon a user input at the second display area of the GUI, the input signal corresponding to at least one modification of the at least one data table; (ii) transmit the input signal to the DMC computing device; (iii) receive an updated model from the DMC computing device, the updated model incorporating the at least one modification of the at least one data table; and/or (iv) display the updated model. In some embodiments of the GUI, the first display area may be further configured to display a simulation of the at least one model, the simulation including a representation of the collision at the determined location.

In another embodiment, a computer-implemented method for controlling a graphical user interface (GUI) for a dynamic model creation (DMC) system may be provided. The DMC system may include a DMC computing device in communication with a database, the database storing at least one model generated by the DMC computing device for representing a vehicle involved in a collision based upon collected data. The method may include, via the DMC system and/or DMC computing device: (i) displaying a first display area, wherein the first display area is programmed to display the at least one model including a visual representation of a determined location where the collision occurred, the visual representation of the determined location based in part on map data retrieved from the database and a visual representation of the vehicle involved in the collision; and/or (ii) displaying a second display area, wherein the second display area is programmed to display at least one data table corresponding to the at least one model, the at least one data table including telematics data regarding the vehicle involved in the collision, wherein movement of the visual representation of the vehicle on the GUI during a simulation of the at least one model is controlled at least by the telematics data; and wherein the GUI is configured to receive user inputs such that the visual representations in the first display area and the at least one data table in the second display area are dynamically modifiable by a user. The computer-implemented method may include additional, less, or alternate actions, including those discussed elsewhere herein.

In some embodiments of the computer-implemented method, the first display area may be further programmed to display a visual representation of a second vehicle involved in the collision, and wherein the second display area is further programmed to display the at least one data table including telematics data regarding the second vehicle involved in the collision. In some embodiments of the method, the first display area may be further programmed to display: (i) the visual representation of the vehicle at a first plurality of moments in time during the collision; and/or (ii) the visual representation of the second vehicle at a second plurality of moments in time during the collision.

In some embodiments of the computer-implemented method, the first display area may be further programmed to display the visual representation of the determined location, wherein the visual representation of the determined location includes a visual representation of at least one of i) a regulatory signal, ii) a regulatory sign, iii) a road feature, and/or iv) a road topography.

In some embodiments, the computer-implemented method may further include: (i) generating an input signal based upon a user input at the first display area of the GUI, the input signal corresponding to at least one modification of at least one visual representation in the first display area; (ii) transmitting the input signal to the DMC computing device; (iii) receiving an updated model from the DMC computing device, the updated model incorporating the at least one modification of the at least one visual representation; and/or (iv) displaying the updated model.

In some embodiments, the computer-implemented method may further include (i) generating an input signal based upon a user input at the second display area of the GUI, the input signal corresponding to at least one modification of the at least one data table; (ii) transmitting the input signal to the DMC computing device; (iii) receiving an updated model from the DMC computing device, the updated model incorporating the at least one modification of the at least one data table; and/or (iv) displaying the updated model.

In yet another embodiment a non-transitory computer-readable media having computer-executable instructions embodied thereon may be provided. When executed by a dynamic model creation (DMC) system including a DMC computing device including a processor in communication with a memory device, the memory device storing at least one model generated by the DMC computing device for representing a vehicle involved in a collision based upon collected data, the computer-executable instructions may cause the processor to control a graphical user interface (GUI) included in the DMC system to: (i) display a first display area, wherein the first display area is programmed to display the at least one model including a visual representation of a determined location where the collision occurred, the visual representation of the determined location based in part on map data retrieved from the memory device and a visual representation of the vehicle involved in the collision; and/or (ii) display a second display area, wherein the second display area is programmed to display at least one data table corresponding to the at least one model, the at least one data table including telematics data regarding the vehicle involved in the collision, wherein movement of the visual representation of the vehicle on the GUI during a simulation of the at least one model is controlled at least by the telematics data, and wherein the GUI is configured to receive user inputs such that the visual representations in the first display area and the at least one data table in the second display area are dynamically modifiable by a user. The computer-readable storage media may include additional, less, or alternate actions, including those discussed elsewhere herein.

In some embodiments of the computer-readable storage media, the first display area may be further programmed to display a visual representation of a second vehicle involved in the collision, and wherein the second display area is further programmed to display the at least one data table including telematics data regarding the second vehicle involved in the collision. In some embodiments of the computer-readable storage media, the first display area may be further programmed to display: (i) the visual representation of the vehicle at a first plurality of moments in time during the collision; and/or (ii) the visual representation of the second vehicle at a second plurality of moments in time during the collision. In some embodiments of the computer-readable storage media, the first display area may be further programmed to display the visual representation of the determined location, wherein the visual representation of the determined location includes a visual representation of at least one of i) a regulatory signal, ii) a regulatory sign, iii) a road feature, and iv) a road topography.

In some embodiments, the computer-executable instructions may further cause the processor to control a GUI included in the DMC system to: (i) generate an input signal based upon a user input at the first display area of the GUI, the input signal corresponding to at least one modification of at least one visual representation in the first display area; (ii) transmit the input signal to the DMC computing device; (iii) receive an updated model from the DMC computing device, the updated model incorporating the at least one modification of the at least one visual representation; and/or (iv) display the updated model.

In some embodiments, the computer-executable instructions may further cause the processor to control a GUI included in the DMC system to: (i) generate an input signal based upon a user input at the second display area of the GUI, the input signal corresponding to at least one modification of the at least one data table; (ii) transmit the input signal to the DMC computing device; (iii) receive an updated model from the DMC computing device, the updated model incorporating the at least one modification of the at least one data table; and/or (iv) display the updated model. In some embodiments of the computer-readable storage media, the first display area may be further configured to display a simulation of the at least one model, the simulation including a representation of the collision at the determined location.

Additional Considerations

As will be appreciated based upon the foregoing specification, the above-described embodiments of the disclosure may be implemented using computer programming or engineering techniques including computer software, firmware, hardware or any combination or subset thereof. Any such resulting program, having computer-readable code means, may be embodied or provided within one or more computer-readable media, thereby making a computer program product, an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps," or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor."

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

In one embodiment, a computer program is provided, and the program is embodied on a computer readable medium. In an exemplary embodiment, the system is executed on a single computer system, without requiring a connection to a sever computer. In a further embodiment, the system is being run in a Windows® environment (Windows is a registered trademark of Microsoft Corporation, Redmond, Washington). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality. In some embodiments, the system includes multiple components distributed among a plurality of computing devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes.

As used herein, an element or step recited in the singular and preceded by the word "a" or "an" should be understood as not excluding plural elements or steps, unless such exclusion is explicitly recited. Furthermore, references to "exemplary embodiment" or "one embodiment" of the present disclosure are not intended to be interpreted as excluding the existence of additional embodiments that also incorporate the recited features.

The patent claims at the end of this document are not intended to be construed under 35 U.S.C. § 112(f) unless traditional means-plus-function language is expressly recited, such as "means for" or "step for" language being expressly recited in the claim(s).

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Upon reading this disclosure, those of skill in the art will appreciate still additional alternative structural and functional designs for system and a method for assigning mobile device data to a vehicle through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The particular features, structures, or characteristics of any specific embodiment may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

We claim:

1. A dynamic model creation (DMC) computing device controlling a graphical user interface (GUI), the DMC computing device in communication with a database, the database storing at least one model generated by the DMC computing device for representing a vehicle involved in a collision based upon collected data, the GUI comprising:
   a first display area programmed to display the at least one model including:
      a visual representation of a determined location where the collision occurred, the visual representation of the determined location based in part on map data retrieved from the database; and
      a visual representation of the vehicle involved in the collision; and
   a second display area programmed to display:
      at least one data table corresponding to the at least one model, the at least one data table including telematics data regarding the vehicle involved in the collision,
   wherein movement of the visual representation of the vehicle on the GUI during a simulation of the at least one model is controlled at least by the telematics data, wherein receipt of at least one user input at the second display area causes updated telematics data to be displayed in the second display area and updated movement of the visual representation of the vehicle to be displayed in the first display area, and wherein the DMC computing device is configured to:
      identify at least one discrepancy between the telematics data and the updated telematics data;
      based on the at least one discrepancy, determine a first weight to apply to at least part of the telematics data and a second weight to apply to at least part of the updated telematics data, wherein the first weight is greater than the second weight; and
      cause the updated movement of the visual representation of the vehicle on the GUI to be weighted more heavily toward the telematics data than the updated telematics data based on the first weight being greater than the second weight.

2. The GUI of claim 1, wherein the first display area is further programmed to display a visual representation of a second vehicle involved in the collision and the second display area is further programmed to display the at least one data table including telematics data regarding the second vehicle involved in the collision.

3. The GUI of claim 2, wherein the first display area is further programmed to display:
   the visual representation of the vehicle at a first plurality of moments in time during the collision; and
   the visual representation of the second vehicle at a second plurality of moments in time during the collision.

4. The GUI of claim 1, wherein the first display area is further programmed to display the visual representation of the determined location, wherein the visual representation of the determined location includes a visual representation of at least one of i) a regulatory signal, ii) a regulatory sign, iii) a road feature, and iv) a road topography.

5. The GUI of claim 1, wherein the first display area is further programmed to:
   generate an input signal based upon a user input at the first display area of the GUI, the input signal corresponding to at least one modification of at least one visual representation in the first display area;
   transmit the input signal to the DMC computing device;
   receive an updated model from the DMC computing device, the updated model incorporating the at least one modification of the at least one visual representation; and
   display the updated model.

6. The GUI of claim 1, wherein the second display area is further programmed to:
   generate an input signal based upon a user input at the second display area of the GUI, the input signal corresponding to at least one modification of the at least one data table;
   transmit the input signal to the DMC computing device;

receive an updated model from the DMC computing device, the updated model incorporating the at least one modification of the at least one data table; and
display the updated model.

7. The GUI of claim 1, wherein the first display area is further configured to display a simulation of the at least one model, the simulation comprising a representation of the collision at the determined location.

8. A method for controlling a graphical user interface (GUI) for a dynamic model creation (DMC) system, the DMC system including a DMC computing device in communication with a database, the database storing at least one model generated by the DMC computing device for representing a vehicle involved in a collision based upon collected data, the method comprising:
displaying a first display area, wherein the first display area is programmed to display the at least one model including:
a visual representation of a determined location where the collision occurred, the visual representation of the determined location based in part on map data retrieved from the database; and
a visual representation of the vehicle involved in the collision; and
displaying a second display area, wherein the second display area is programmed to display:
at least one data table corresponding to the at least one model, the at least one data table including telematics data regarding the vehicle involved in the collision,
wherein movement of the visual representation of the vehicle on the GUI during a simulation of the at least one model is controlled at least by the telematics data,
wherein receipt of at least one user input at the second display area causes updated telematics data to be displayed in the second display area and updated movement of the visual representation of the vehicle to be displayed in the first display area, and
wherein the DMC computing device is configured to:
identify at least one discrepancy between the telematics data and the updated telematics data;
based on the at least one discrepancy, determine a first weight to apply to at least part of the telematics data and a second weight to apply to at least part of the updated telematics data, wherein the first weight is greater than the second weight; and
cause the updated movement of the visual representation of the vehicle on the GUI to be weighted more heavily toward the telematics data than the updated telematics data based on the first weight being greater than the second weight.

9. The GUI of claim 1, wherein the DMC computing device is further configured to flag the at least one discrepancy in the database as an alert for an insurance representative associated with a user computing device to notify the insurance representative of the at least one discrepancy.

10. The GUI of claim 1, wherein the DMC computing device is further configured to determine at least one of the first weight or the second weight based at least in part upon an output from a machine learning program.

11. The method of claim 8, wherein the first display area is further programmed to display a visual representation of a second vehicle involved in the collision, and wherein the second display area is further programmed to display the at least one data table including telematics data regarding the second vehicle involved in the collision.

12. The method of claim 11, wherein the first display area is further programmed to display:
the visual representation of the vehicle at a first plurality of moments in time during the collision; and
the visual representation of the second vehicle at a second plurality of moments in time during the collision.

13. The method of claim 8, wherein the first display area is further programmed to display the visual representation of the determined location, wherein the visual representation of the determined location includes a visual representation of at least one of i) a regulatory signal, ii) a regulatory sign, iii) a road feature, and iv) a road topography.

14. The method of claim 8, further comprising:
generating an input signal based upon a user input at the first display area of the GUI, the input signal corresponding to at least one modification of at least one visual representation in the first display area;
transmitting the input signal to the DMC computing device;
receiving an updated model from the DMC computing device, the updated model incorporating the at least one modification of the at least one visual representation; and
displaying the updated model.

15. The method of claim 8, further comprising:
generating an input signal based upon a user input at the second display area of the GUI, the input signal corresponding to at least one modification of the at least one data table;
transmitting the input signal to the DMC computing device;
receiving an updated model from the DMC computing device, the updated model incorporating the at least one modification of the at least one data table; and
displaying the updated model.

16. A non-transitory computer-readable media having computer-executable instructions embodied thereon, wherein when executed by a dynamic model creation (DMC) system including a DMC computing device including a processor in communication with a memory device, the computer-executable instructions cause the processor to control a graphical user interface (GUI) included in the DMC system to:
display a first display area, wherein the first display area is programmed to display at least one model generated by the DMC computing device for representing a vehicle involved in a collision based upon collected data, the at least one model including:
a visual representation of a determined location where the collision occurred, the visual representation of the determined location based in part on map data retrieved from the memory device; and
a visual representation of the vehicle involved in the collision; and
display a second display area, wherein the second display area is programmed to display:
at least one data table corresponding to the at least one model, the at least one data table including telematics data regarding the vehicle involved in the collision,
wherein movement of the visual representation of the vehicle on the GUI during a simulation of the at least one model is controlled at least by the telematics data,
wherein receipt of at least one user input at the second display area causes updated telematics data to be displayed in the second display area and updated movement of the visual representation of the vehicle to be displayed in the first display area, and wherein the DMC computing device is configured to:
- identify at least one discrepancy between the telematics data and the updated telematics data;
- based on the at least one discrepancy, determine a first weight to apply to at least part of the telematics data and a second weight to apply to at least part of the updated telematics data, wherein the first weight is greater than the second weight; and
- cause the updated movement of the visual representation of the vehicle on the GUI to be weighted more heavily toward the telematics data than the updated telematics data based on the first weight being greater than the second weight.

17. The non-transitory computer-readable media of claim 16, wherein the first display area is further programmed to display a visual representation of a second vehicle involved in the collision, and wherein the second display area is further programmed to display the at least one data table including telematics data regarding the second vehicle involved in the collision.

18. The non-transitory computer-readable media of claim 16, wherein the first display area is further programmed to display the visual representation of the determined location, wherein the visual representation of the determined location includes a visual representation of at least one of i) a regulatory signal, ii) a regulatory sign, iii) a road feature, and iv) a road topography.

19. The non-transitory computer-readable media of claim 16, wherein the computer-executable instructions further cause the processor to control the GUI included in the DMC system to:
- generate an input signal based upon a user input at the first display area of the GUI, the input signal corresponding to at least one modification of at least one visual representation in the first display area;
- transmit the input signal to the DMC computing device;
- receive an updated model from the DMC computing device, the updated model incorporating the at least one modification of the at least one visual representation; and
- display the updated model.

20. The non-transitory computer-readable media of claim 16, wherein the computer-executable instructions further cause the processor to control the GUI included in the DMC system to:
- generate an input signal based upon a user input at the second display area of the GUI, the input signal corresponding to at least one modification of the at least one data table;
- transmit the input signal to the DMC computing device;
- receive an updated model from the DMC computing device, the updated model incorporating the at least one modification of the at least one data table; and
- display the updated model.

* * * * *